United States Patent
Lee et al.

(10) Patent No.: US 8,217,474 B2
(45) Date of Patent: Jul. 10, 2012

(54) HERMETIC MEMS DEVICE AND METHOD FOR FABRICATING HERMETIC MEMS DEVICE AND PACKAGE STRUCTURE OF MEMS DEVICE

(75) Inventors: Chien-Hsing Lee, Hsinchu County (TW); Tsung-Min Hsieh, Taipei County (TW); Jhyy-Cheng Liou, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 294 days.

(21) Appl. No.: 12/647,559

(22) Filed: Dec. 28, 2009

(65) Prior Publication Data

US 2011/0156106 A1 Jun. 30, 2011

(51) Int. Cl.
*H01L 27/14* (2006.01)

(52) U.S. Cl. ............... 257/414; 257/254; 257/E27.062; 257/E23.001; 257/E29.234

(58) Field of Classification Search ............. 257/414, 257/254, E27.062, E23.001, E29.234
See application file for complete search history.

(56) References Cited

U.S. PATENT DOCUMENTS

| | | | |
|---|---|---|---|
| 6,939,473 B2 | 9/2005 | Nasiri et al. | |
| 7,250,353 B2 | 7/2007 | Nasiri et al. | |
| 7,458,263 B2 | 12/2008 | Nasiri et al. | |
| 7,956,428 B2 * | 6/2011 | Yama | 257/415 |
| 2006/0057836 A1 * | 3/2006 | Nagarajan et al. | 438/622 |
| 2007/0199974 A1 | 8/2007 | Babinetz et al. | |
| 2008/0026506 A1 * | 1/2008 | Kim et al. | 438/109 |

* cited by examiner

*Primary Examiner* — Bradley K Smith
*Assistant Examiner* — Mohammad T Karimy
(74) *Attorney, Agent, or Firm* — Jianq Chyun IP Office

(57) ABSTRACT

A hermetic microelectromechanical system (MEMS) package includes a CMOS MEMS chip and a second substrate. The CMOS MEMS Chip has a first substrate, a structural dielectric layer, a CMOS circuit and a MEMS structure. The structural dielectric layer is disposed on a first side of the first structural substrate. The structural dielectric layer has an interconnect structure for electrical interconnection and also has a protection structure layer. The first structural substrate has at least a hole. The hole is under the protection structure layer to form at least a chamber. The chamber is exposed to the environment in the second side of the first structural substrate. The chamber also comprises a MEMS structure. The second substrate is adhered to a second side of the first substrate over the chamber to form a hermetic space and the MEMS structure is within the space.

24 Claims, 29 Drawing Sheets

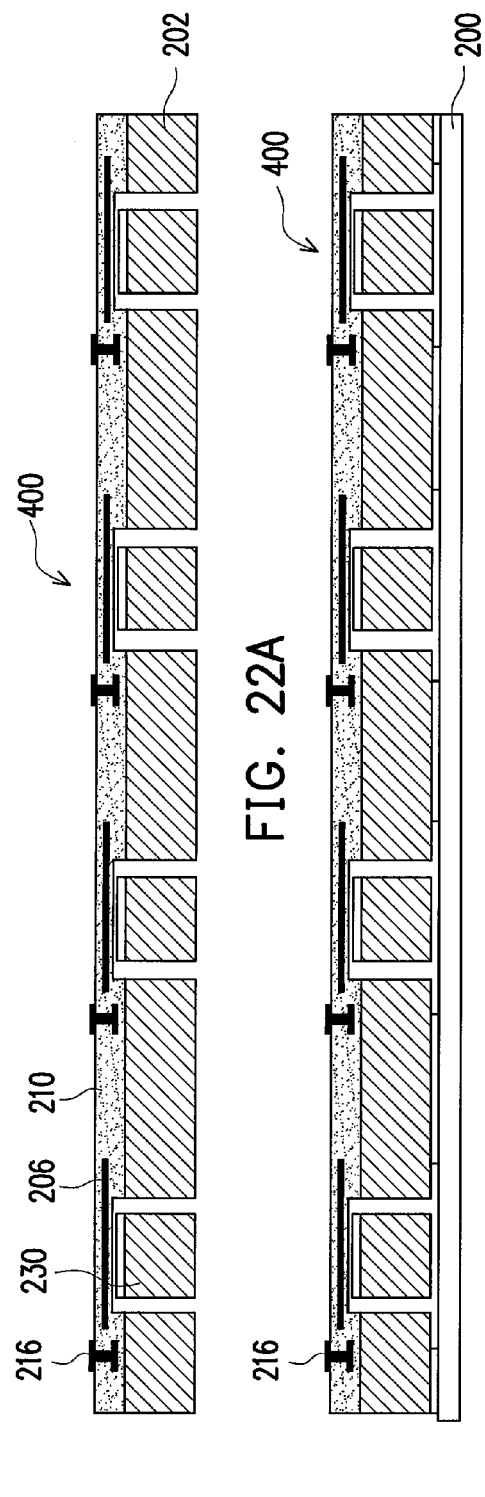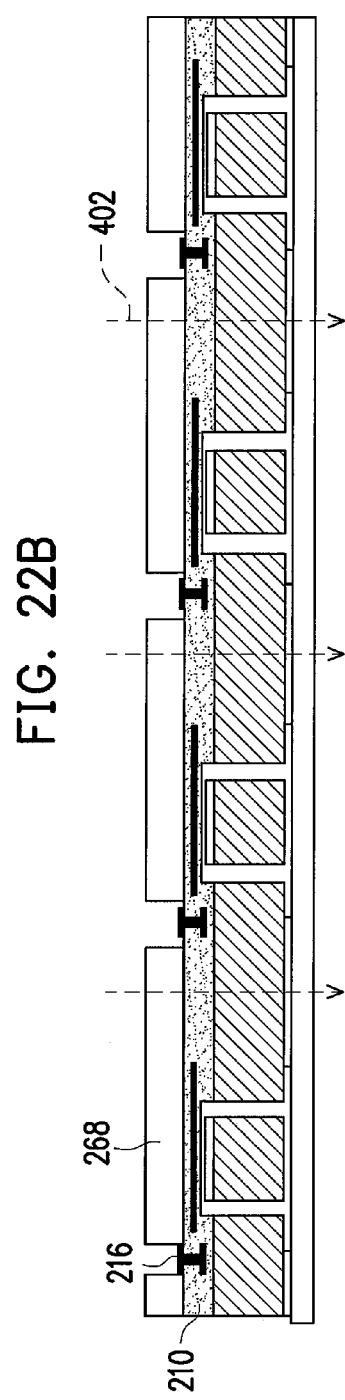
FIG. 22A
FIG. 22B
FIG. 22C

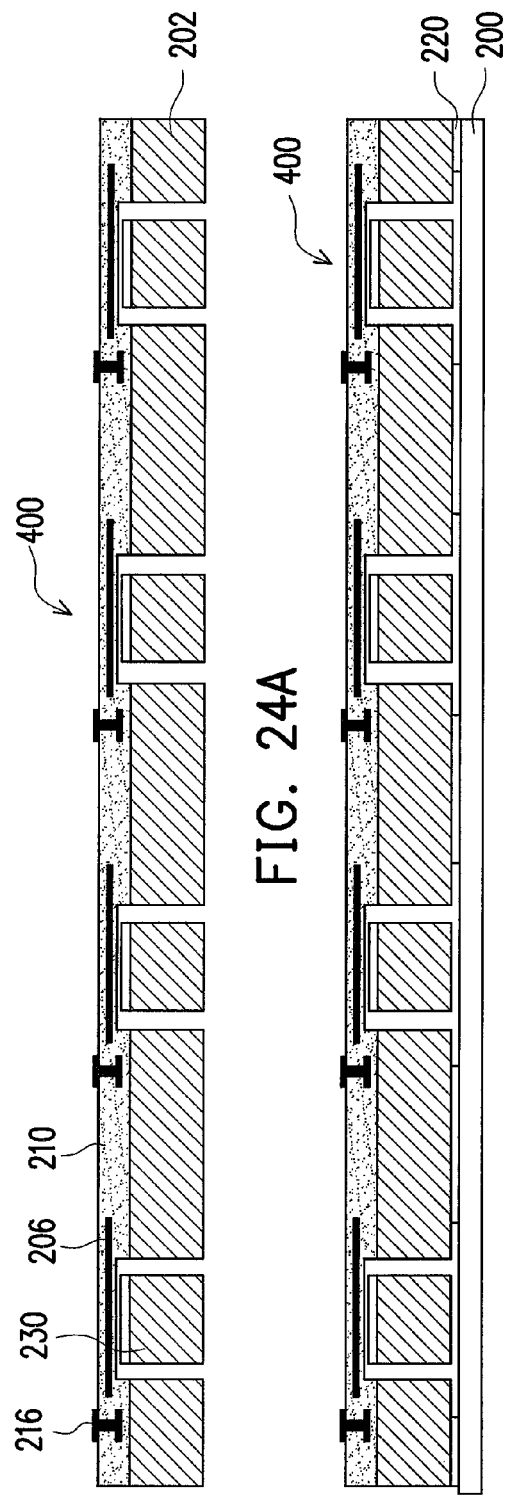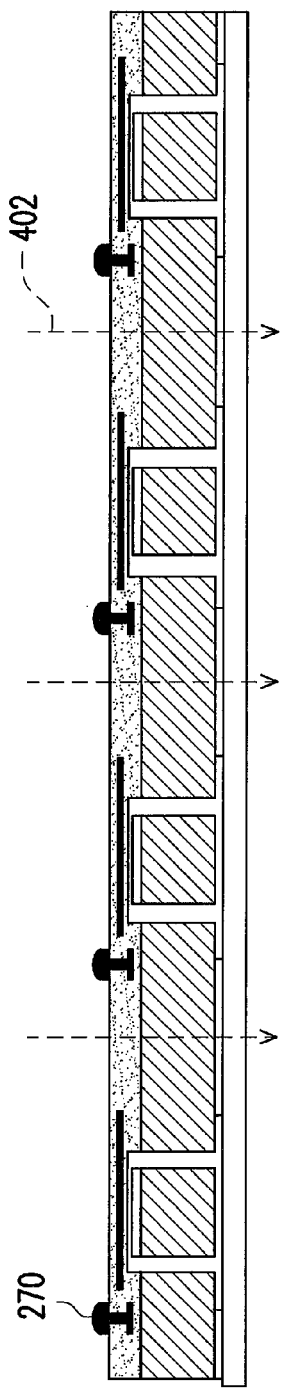

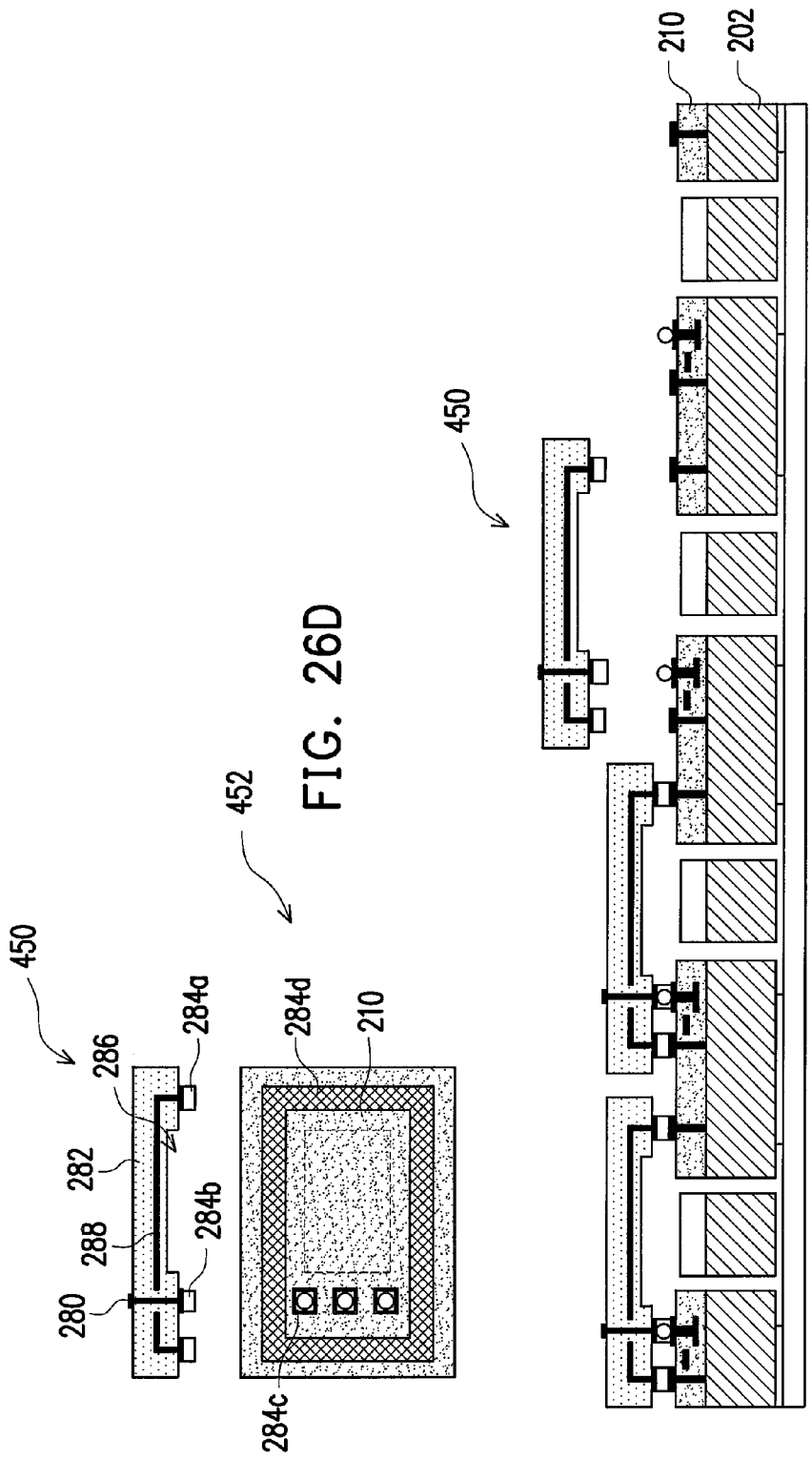

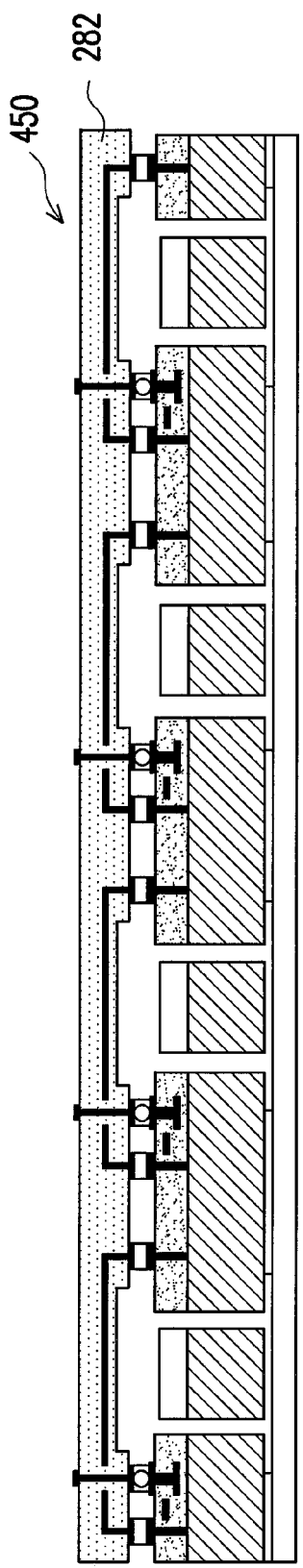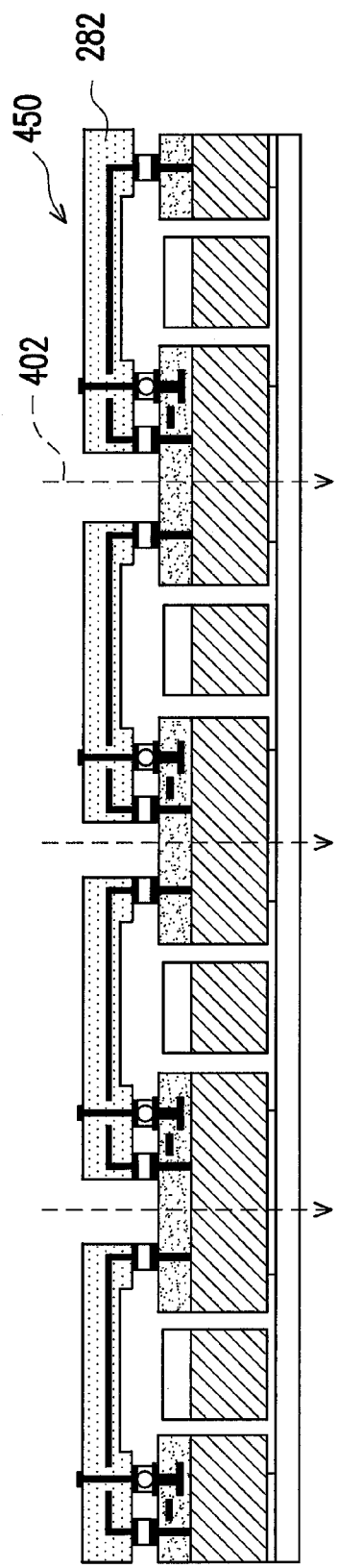

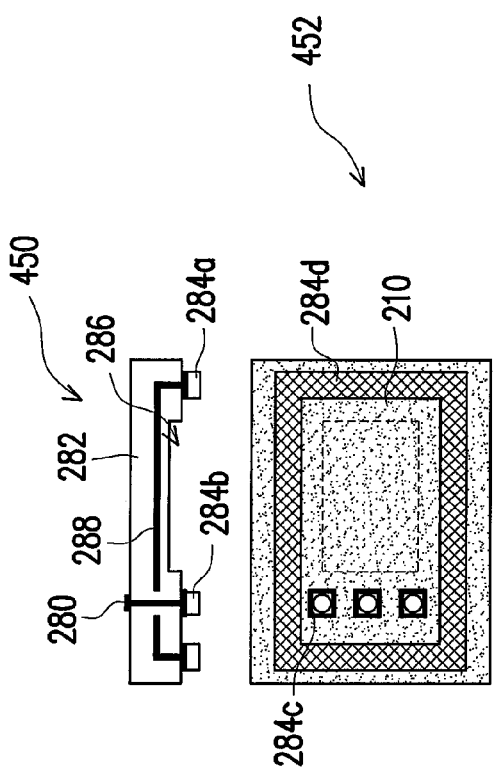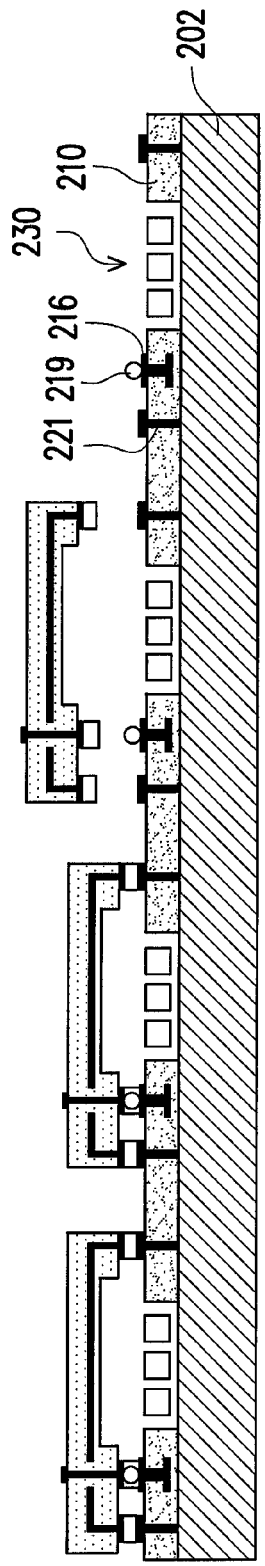
FIG. 29D
FIG. 29E

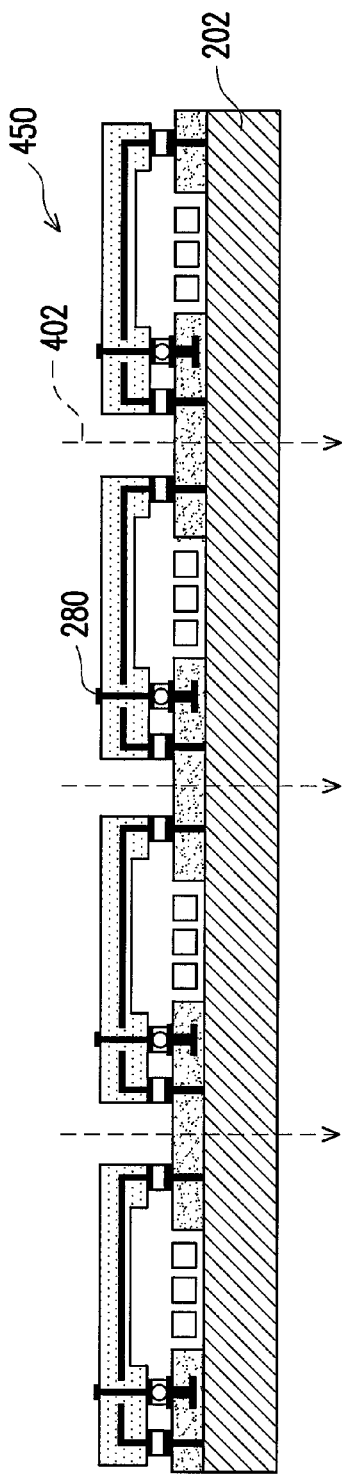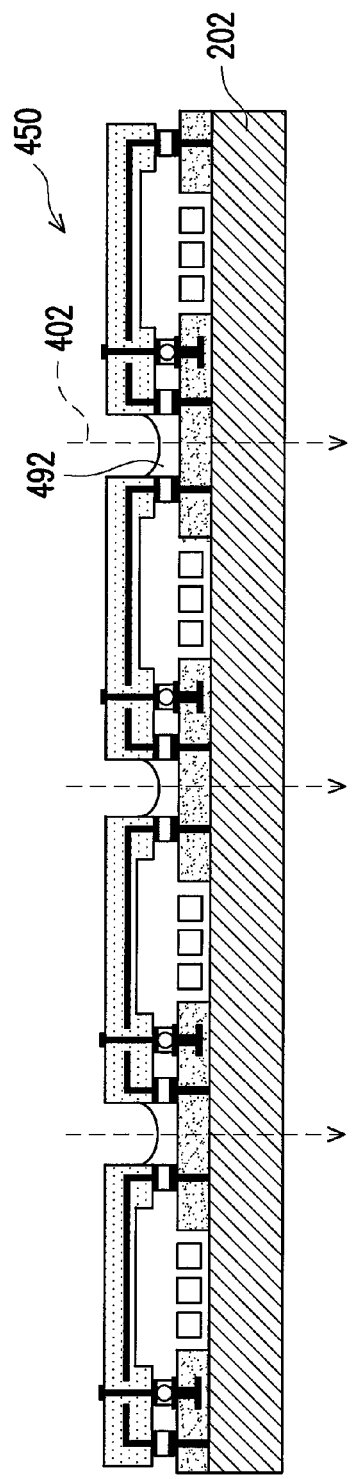
FIG. 29F
FIG. 29G

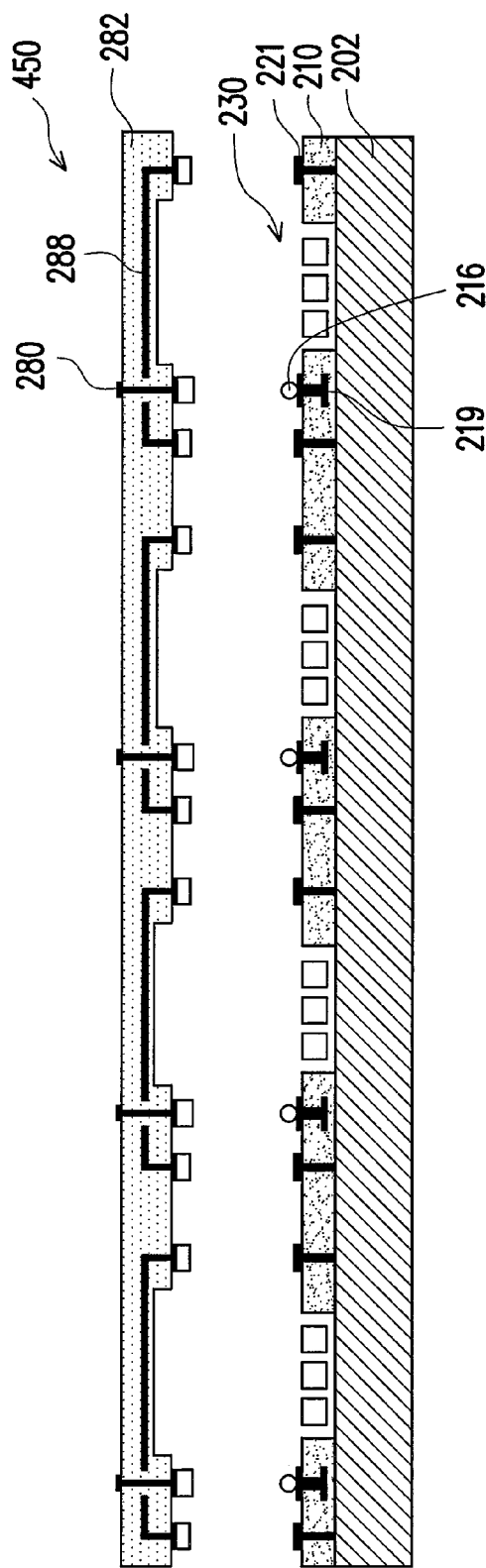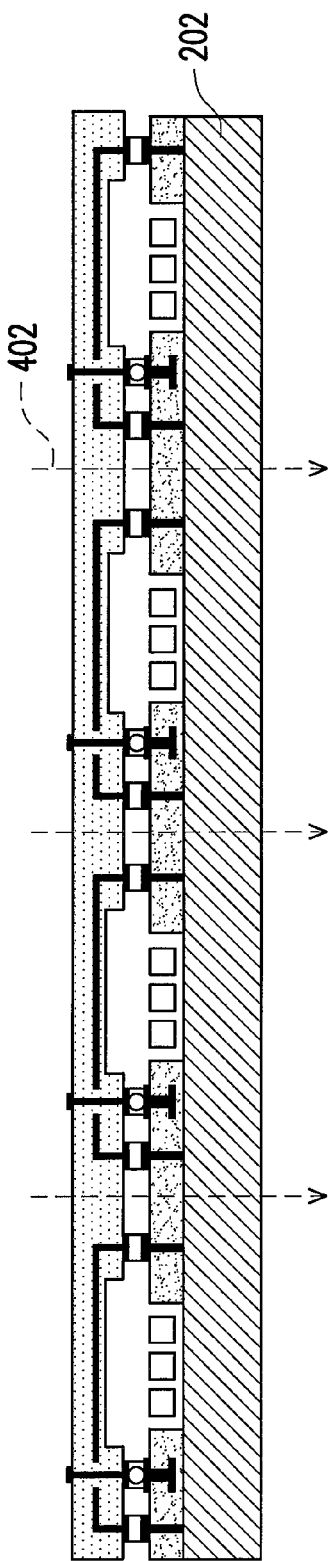
FIG. 29H
FIG. 29I

US 8,217,474 B2

HERMETIC MEMS DEVICE AND METHOD FOR FABRICATING HERMETIC MEMS DEVICE AND PACKAGE STRUCTURE OF MEMS DEVICE

BACKGROUND

1. Field of Invention

The present invention relates to microelectromechanical system (MEMS) device. More particularly, the present invention relates to a structure of MEMS device and the fabrication process.

2. Description of Related Art

MEMS device has been proposed in various applications. However, the MEMS device usually is staying in an open environment. Since the MEMS structure of the MEMS device is sensitive to the environmental air, the operation in open environment may pick up noise. A hermetic package for MEMS device is then proposed.

A hermetic MEMS package has properties including isolating the MEMS structure from the outside environment. For example, the damping of air and thermal noise can be avoided by forming a vacuum environment for MEMS. In addition, hermetic camber can protects the MEMS device from EM interference and produce a small size MEMS device with high performance and low cost for popularity. The applications for the hermetic MEMS packages include accelerometer, gyroscope, resonator, or RF MEMS components.

For the current hermetic MEMS products, the MEMS structure and sensing or driving circuits are manufactured in separate substrate. The MEMS structures include sensors or actuators. The MEMS sensors are able to sense the physical signal, for example, acceleration and angular velocity, and transfer to the electrical signal and the electrical signal becomes readable via the sensing circuits; while the MEMS actuators are able to create a mechanical motion via the driving circuits. Both sensing and driving circuits are manufactured by well-known CMOS process. FIG. 1 is a cross-sectional view, illustrating conventional hermetic MEMS device. In FIG. 1, the conventional hermetic MEMS device includes a lower substrate 100, a middle substrate 102 and a top substrate 104. The lower substrate 100 is patterned to have an indent space 106 and a CMOS circuit with the connection pad 114 as the sensing IC. The middle substrate 102 is fabricated into a sensing element with the venting holes 110. The top substrate 104 is fabricated like a cap with the indent space 108. The middle substrate 102 is adhered with the bottom substrate 100 and the top substrate 104 by the adhering rings 112. As a result, the indent spaces 106 and 108 with the venting holes 110 form a hermetic chamber.

However, this conventional process has some drawbacks, including high cost, production yield issue due to three elements being packaged into a device, and parasitic effect for the conjunction of MEMS and sensing IC.

SUMMARY

An aspect of the invention provides a hermetic device can at least reduce the drawbacks as mentioned above.

An embodiment of the disclosure provides a hermetic MEMS package, which includes a CMOS MEMS chip having a first structural substrate, a structural dielectric layer, a CMOS circuit, a MEMS structure and a second substrate. The structural dielectric layer is disposed on a first side of the first structural substrate. The structural dielectric layer has an interconnect structure for electrical interconnection and also has a protection structure layer. The first structural substrate has at least a hole. The protection structure layer is over the hole to form at least a chamber. The chamber is exposed to the environment in the second side of the first structural substrate. The MEMS structure is exposed in the chamber. The second substrate is adhered to a second side of the first substrate over the chamber to form a hermetic space and the MEMS structure is within the space, wherein the second substrate does not have a part of the CMOS circuit.

An embodiment of the disclosure also provides a method for fabricating a hermetic microelectromechanical system (MEMS) device. The method includes providing a first substrate. Then, a structural dielectric layer is formed over a first side of the first substrate, wherein a CMOS circuit and a MEMS structure are formed in the first substrate and the structural dielectric layer. The first substrate and the structural dielectric layer are patterned from a second side of the first substrate to form a chamber wherein the MEMS structure is exposed in the chamber. A second substrate is adhered over the second side of the first substrate to seal the chamber from the second side of the first substrate.

An embodiment of the disclosure also provides a package structure of MEMS device, which includes a MEMS die, a packaging circuit substrate and a molding layer. The MEMS die comprises a CMOS MEMS chip having a first structural substrate, a structural dielectric layer, a MEMS structure, a CMOS circuit, and a second substrate. The structural dielectric layer is disposed on a first side of the first structural substrate. The structural dielectric layer has an interconnect structure for electrical interconnection and also has a protection structure layer. The first structural substrate has at least a hole. The protection structure layer is over the hole to form at least a chamber. The chamber is exposed to the environment in the second side of the first structural substrate. The chamber also comprises a MEMS structure. The second substrate is adhered to a second side of the first substrate over the chamber to form a hermetic space and the MEMS structure within the space, wherein the second substrate does not have a part of the CMOS circuit. The packaging circuit substrate holds the MEMS die. The molding layer encapsulates over the MEMS die and the leadframe.

An embodiment of the disclosure also provides a package structure of MEMS device. The package structure of MEMS device includes a CMOS MEMS chip having a first structural substrate, a structural dielectric layer, a MEMS structure, a CMOS circuit, a second substrate and a third substrate. The structural dielectric layer is deposited on the first side of the first structural substrate. The structural dielectric comprises an interconnection structure for electrical connection. The first structural substrate and the structural dielectric layer comprise a hole and a MEMS structure is within the hole. The interconnection structure has an output pad structure in the structural dielectric layer to couple the electrical signal of the CMOS MEMS chip out. The second substrate is adhered to a second side of the first substrate over the hole to seal one side of the hole. A conductive bump is on the output pad structure. An adhesive layer is on the output pad structure and also on the top of the structural dielectric layer in the form of a ring structure. The ring structure surrounds the MEMS structure and output pad structure. A third substrate layer, adhered over the structural dielectric layer by the adhesive layer to seal the other side of the hole and a hermetic space is formed. The third substrate layer has an extending output pad structure in the third substrate layer, the extending output pad structure has bottom end electrically connected to the conductive bump and a top end being exposed.

An embodiment of the disclosure also provides a package structure of MEMS device. The package structure of MEMS device includes a CMOS MEMS chip having a first substrate, a structural dielectric layer, a MEMS structure, a CMOS circuit, and a second substrate. The structural dielectric layer is deposited on the first side of the first structural substrate. The structural dielectric layer comprises an interconnection structure for electric connection. The first substrate and the structural dielectric comprise a chamber in the first side of the first substrate. The chamber is exposed to the environment in the top side of the first structural layer against the first structural substrate. The chamber comprises a MEMS structure. The interconnection structure has an output pad structure in the structural dielectric layer to couple the electrical signal of CMOS circuit out. A conductive bump is on the output pad structure. An adhesive layer is on the output pad structure and also on the top of the structural dielectric layer in the form of ring structure. The ring structure surrounds the MEMS structure and output pad structure. The second substrate layer is adhered over the structural dielectric layer by the adhesive layer to seal the chamber and form a hermetic space. The MEMS structure is within the hermetic space. The second substrate layer has an extending output pad structure in the third substrate layer, the extending output pad structure has bottom end electrically connected to the conductive bump and a top end being exposed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 22A-22C are cross-sectional views, schematically illustrating the packaging process for the packaged structure of the MEMS device, according to one of embodiments of the invention.

FIGS. 24A-24C are cross-sectional views, schematically illustrating the packaging process for the packaged structure of the MEMS device, according to one of embodiments of the invention.

FIGS. 26A-26I are cross-sectional views or top views, schematically illustrating the packaging process for the packaged structure of the MEMS device, according to one of embodiments of the invention.

FIGS. 29A-29I are cross-sectional or top views, schematically illustrating the packaging process for the packaged structure of the MEMS device, according to one of embodiments of the invention.

DESCRIPTION OF THE PREFERRED EMBODIMENTS

In the disclosure of the invention, a novel hermetic MEMS device in several embodiments has been proposed. The hermetic MEMS package has at least the following features. The integration between IC and MEMS can increase for high performance. MEMS and sensing IC are manufactures in the same substrate to avoid the parasitic effect for the conjunction of MEMS and sensing IC. The hermetic layer can be formed over the one side of MEMS element by interconnection process of known CMOS technology. Chip scale package (CSP) and wafer level package (WLP) can be used for small size and low cost process. An extra substrate is attached on the other side of MEMS using wafer-wafer bonding or fusion to form a hermetic package.

Several embodiments are provided from descriptions. However, the invention is not limited to the disclosure of the embodiments. In addition, the embodiments can also be properly combined to each other.

Figure 1:
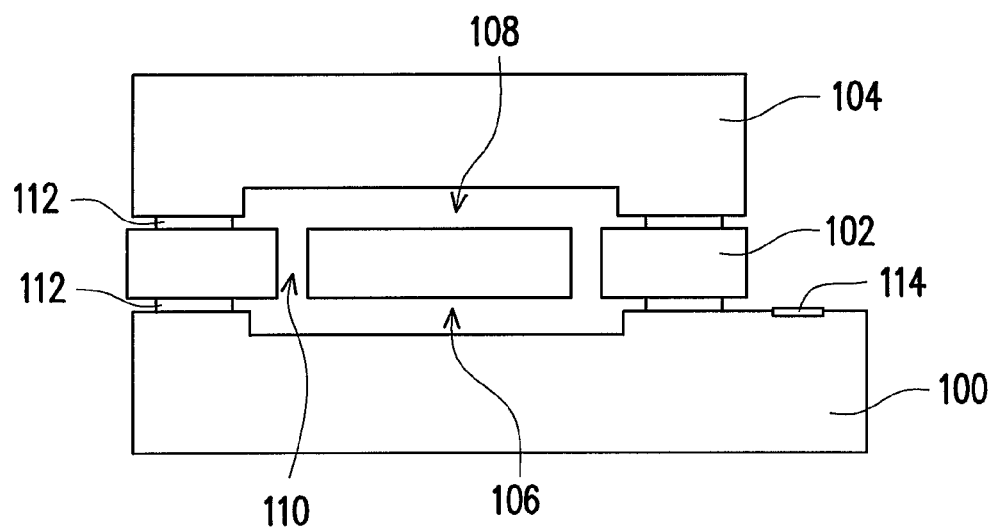
FIG. 1 is a cross-sectional view, illustrating conventional hermetic MEMS device.
Figure 2A:
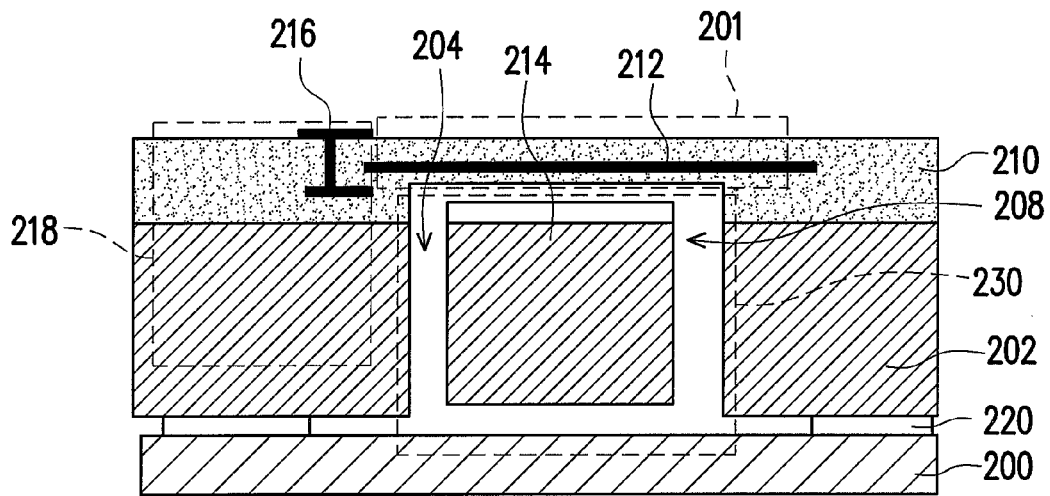
FIG. 2A is a cross-sectional view, schematically illustrating a MEMS package, according to one of embodiments.
Figure 2B:
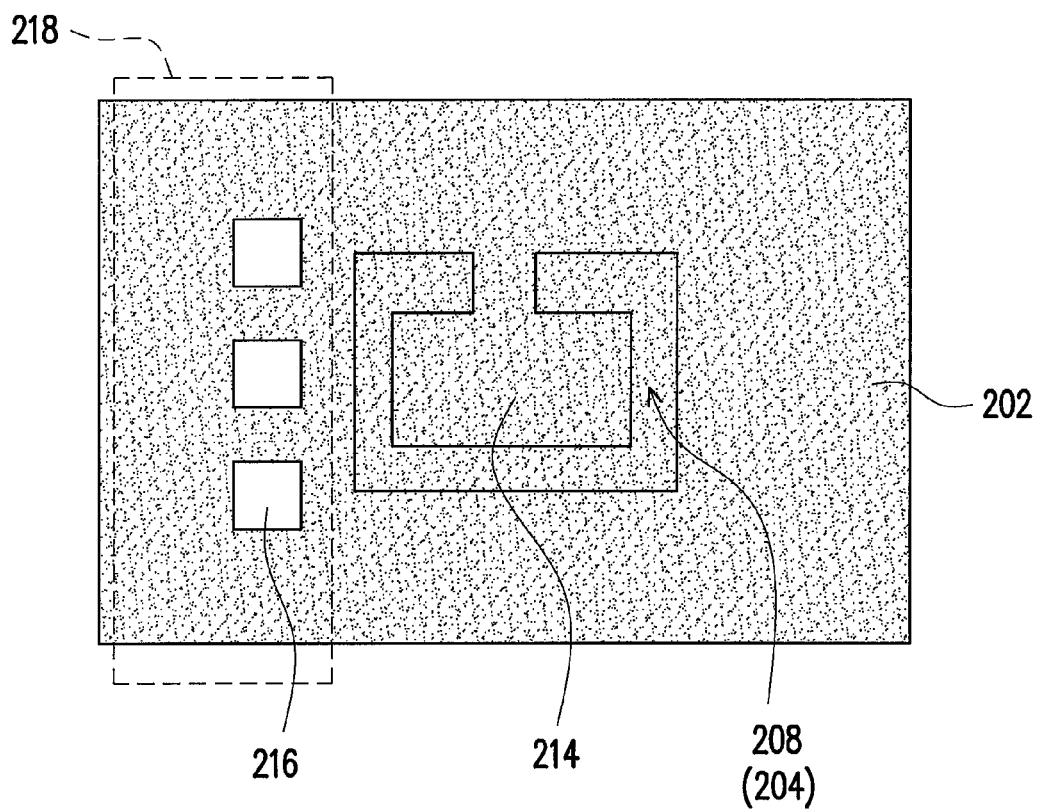
FIG. 2B is a top-view, schematically illustrating internal structure of the MEMS package in FIG. 2A.

FIG. 2A is a cross-sectional view, schematically illustrating a MEMS device with a hermetic package, according to one of embodiments. FIG. 2B is a top-view, schematically illustrating internal structure of the MEMS device in FIG. 2A. In FIGS. 2A and 2B, MEMS device can includes a CMOS MEMS chip, and a second substrate 200. The CMOS MEMS chip includes a first substrate, a structural dielectric layer, a CMOS circuit and a MEMS structure. The first substrate 202, such as a silicon substrate, has chamber 208 and the MEMS structure 214 is exposed in the chamber. The MEMS structure 214, in this example, formed in the substrate 202 and the structural dielectric layer 210 is held by the substrate 202 or structural dielectric 210 at the end portion, so that the MEMS structure 214 can sense the acceleration movement of the MEMS device, for example. The structural dielectric layer 210 is disposed on a first side of the first substrate 202. The structural dielectric layer 210 has an interconnect structure 216. The structural dielectric layer 210 also has the protection layer 212 embedded inside and serves a hermetic layer 201 over the MEMS structure 214. The protection layer can be conductive layer, for example. The structural dielectric layer 210 has indent portion above the MEMS structure 214. The MEMS structure 214 is formed in the first substrate 202 and the structural dielectric layer 210. The CMOS circuit 218 has been formed in the first substrate 202 and the structural dielectric layer 210 by the CMOS fabrication process. The CMOS circuit 218 has an output pad structure 216 in the structural dielectric layer 210. The second substrate 200 is adhered to a second side of the first substrate 202 over the chamber 208 to form a hermetic space for MEMS structure. The second substrate 200 is not necessary to have CMOS circuit. In other words, the second substrate 200 can be, for example, a simple plate also for forming the hermetic space for the MEMS structure 214. The adhesive layer 220 is a closing ring to close the chamber 208. The adhesive layer 220 can be usual adhering material layer or fusing layer. As a result, the structural dielectric layer 210 and the second substrate 200 seal the chamber 208 to have the hermetic space, in which the structural dielectric layer 210 is formed in CMOS process but not by the packaging process.

The second substrate 200 can be silicon, glass, quartz, ceramic etc. The structural dielectric layer, serving as the hermetic layer, is formed by dielectric layers and conductive layers. Such layers are the same as that used in the interconnect structure of CMOS circuits. The MEMS device is a composite of conductive layers, dielectric layers and a portion of a substrate. The hermetic chamber 208 can be a vacuum chamber in one embodiment. The MEMS structure 214 in the chamber can sense the movement of the MEMS device by a position shift, causing the variance of capacitance, for example. The operation mechanism can be known in the art without further descriptions. The MEMS structure 214 can be in various other structures without limited to the embodiment.

Figure 3A:
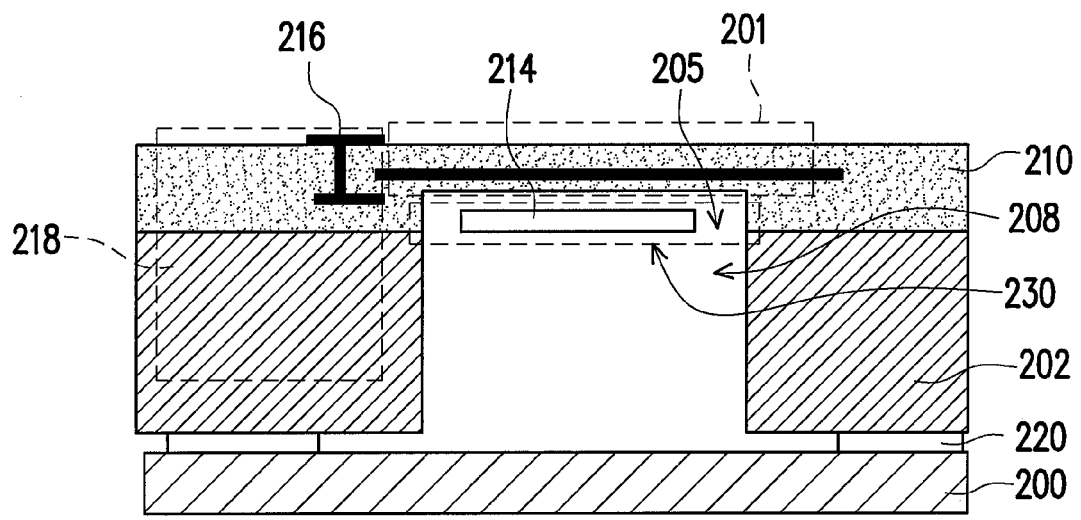
FIG. 3A is a cross-sectional view, schematically illustrating a MEMS package, according to one of embodiments.
Figure 3B:
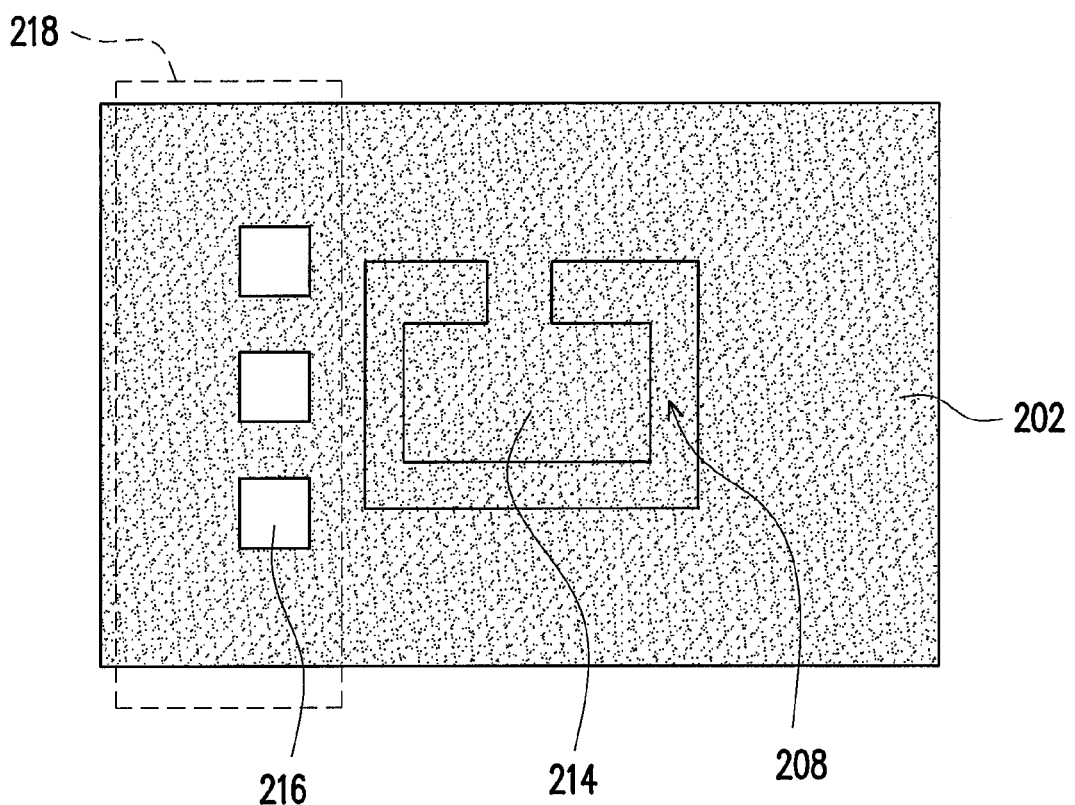
FIG. 3B is a top-view, schematically illustrating the internal structure of the MEMS package in FIG. 3A.

FIG. 3A is a cross-sectional view, schematically illustrating a MEMS device, according to one of embodiments. FIG. 3B is a top-view, schematically illustrating the internal structure of the MEMS device in FIG. 3A. In FIG. 3A and FIG. 3B, the MEMS structure 214 is just formed in the structural dielectric layer 210. The substrate 202 has an opening to serve as a part of the chamber 208. The structural dielectric layer 210 has also an indent space 205 as another part of the chamber 230. The hermetic layer 201 and the output pad structure 216 are embedded in the structural dielectric layer 210. The CMOS circuit 218 is formed in the first substrate 202 and the structural dielectric layer 210. The second substrate 200 is adhered to the first substrate 202 by adhesive layer 220 by adhering material or fusing.

In this embodiment of FIG. 3A and FIG. 3B, the MEMS structure 214 is a composite of conductive and dielectric layers in the structural dielectric layer 210. The MEMS structure 214 in the hermetic chamber 208 can, for example, sense the movement of the MEMS device.

Figure 4:
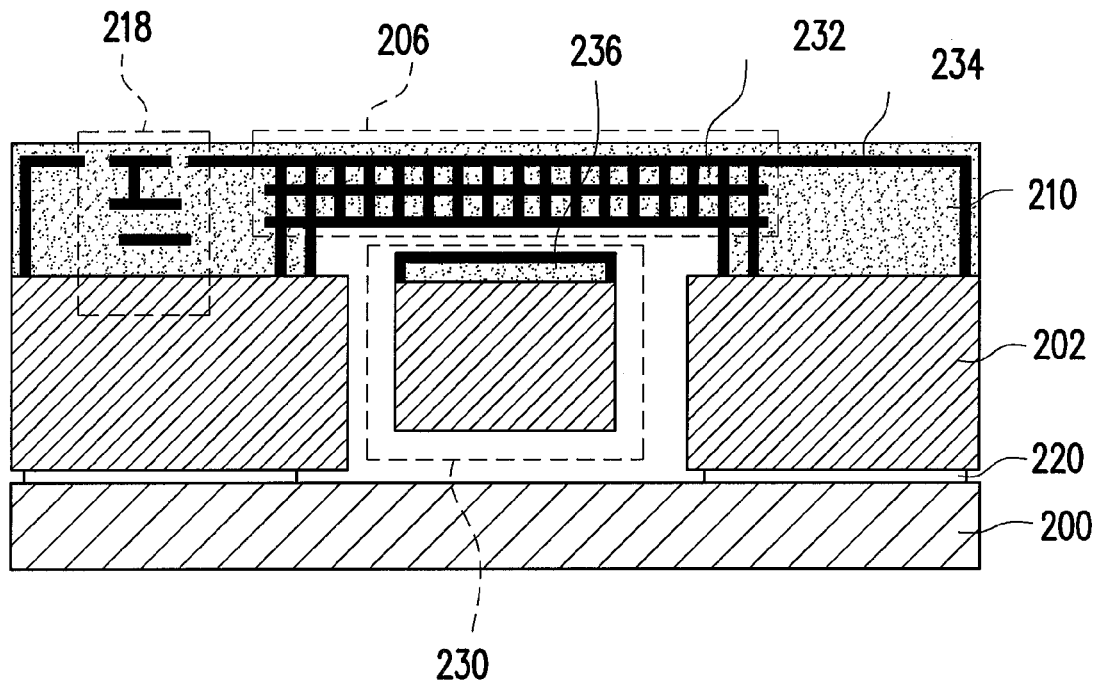
FIG. 4 is a cross-sectional view, schematically illustrating a MEMS package, according to one of embodiments.

FIG. 4 is a cross-sectional view, schematically illustrating a MEMS device, according to one of embodiments. In FIG. 4, the structure of the MEMS device is basically like the structure in FIG. 2A. However, the protection layer in the hermetic layer 206 of the structural dielectric layer 210 is in a grid structure 232. The grid structure 232 has more mechanical strength to resist the external pressure during fabrication. In addition, the surrounding metal layer 234 can also be implemented to shield the device form electromagnetic wave, for example. Even further, the MEMS structure 230 can also include an additional part 236 from the structural dielectric layer 210.

Figure 5:
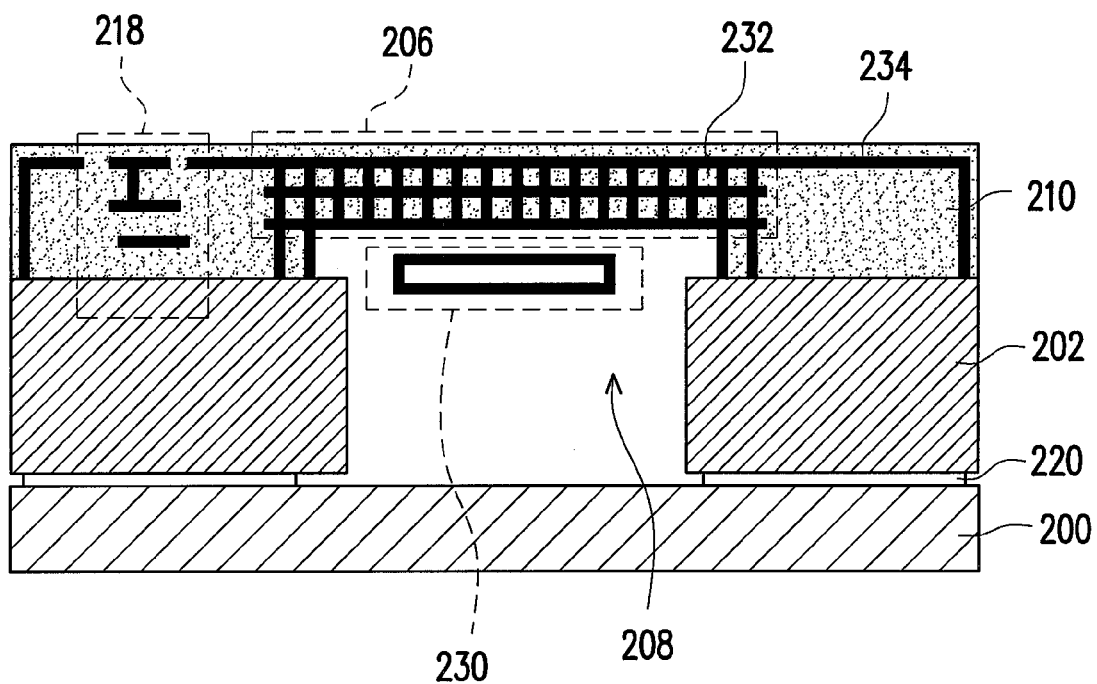
FIG. 5 is a cross-sectional view, schematically illustrating a MEMS package, according to one of embodiments.

FIG. 5 is a cross-sectional view, schematically illustrating a MEMS device, according to one of embodiments. In FIG. 5, it is similar to FIG. 4 and modified from FIG. 3A that the hermetic layer 206 in the structural dielectric layer 210 also includes the grid structure 232 and the surrounding metal layer 234. The MEMS structure 230 is formed in the structural dielectric layer 210.

For the structure of MEMS device, the hermetic layer 206 is formed in the structural dielectric layer 210 layer based on the CMOS fabrication process. The structural dielectric layer 210 layer is not necessarily formed by the packing process. The CMOS circuit 218 can also be formed in the substrate 202 and the structural dielectric layer 210 layer based on the compatible CMOS process. The substrate 200 is then simple adhered to the substrate 202 by adhering manner.

The fabrication processes for the MEMS device are further described as follows. FIGS. 6-9 are cross-sectional views, schematically illustrating a fabrication flow for a MEMS device, according to one of embodiments of the invention.

Figure 6:
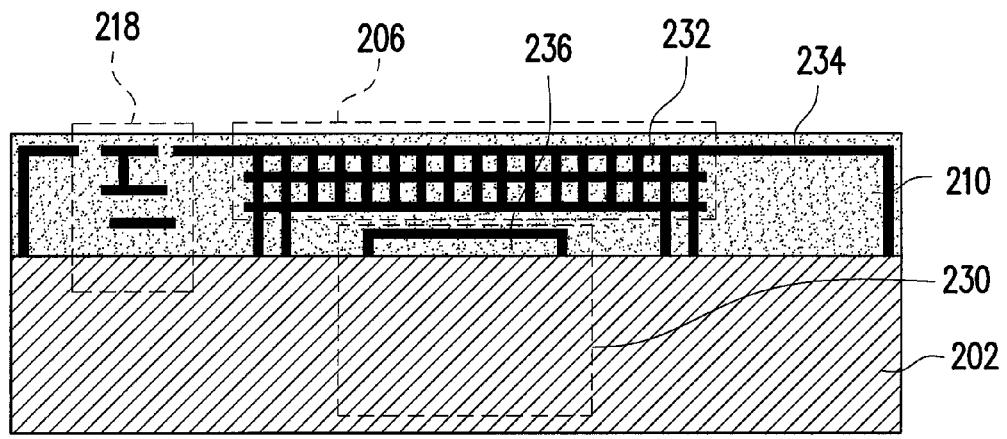
FIGS. 6-9 are cross-sectional views, schematically illustrating a fabrication flow for a MEMS package, according to one of embodiments of the invention.

In FIG. 6, the MEMS device has been formed with the MEMS structure 230, the CMOS circuit 218, and the hermetic layer 206 in the structural dielectric layer 210. The hermetic layer 206 has the embedded grid structure 232, for example. The surrounding metal layer 234 is also formed in the structural dielectric layer 210. At this stage in fabrication, the structural dielectric layer 210 is formed on the substrate 202, such as the silicon substrate.

Figure 7:
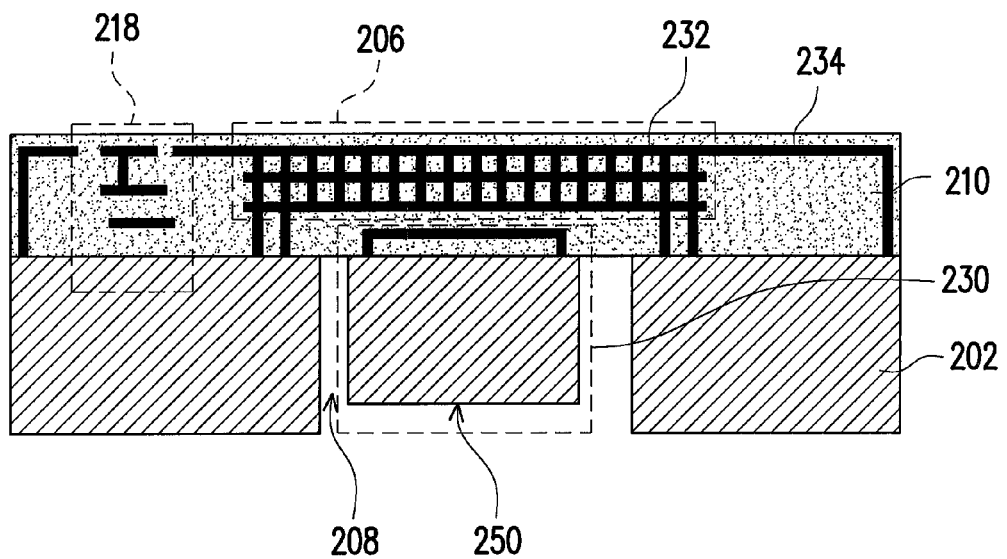

In FIG. 7, the chamber 208 for containing the MEMS structure 230 is to be formed, and the MEMS structure 230 is to be exposed. The substrate 202 is patterned to form venting holes as a part of the chamber 208. The venting holes expose the structural dielectric layer 210. For the MEMS structure 230 in the substrate 202, the bottom is removed by a portion to have the bottom surface 250 being indent.

Figure 8:
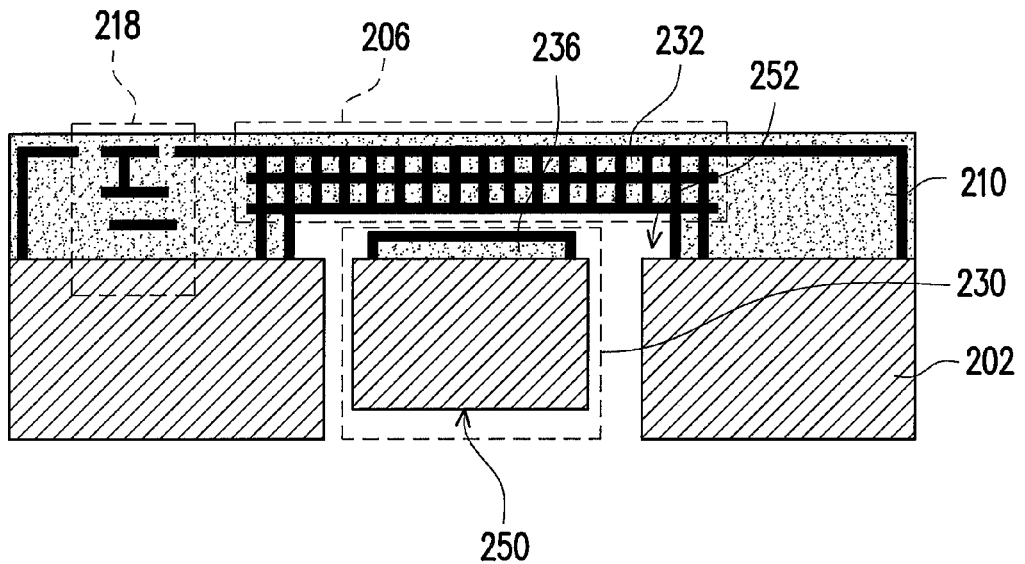
Figure 9:
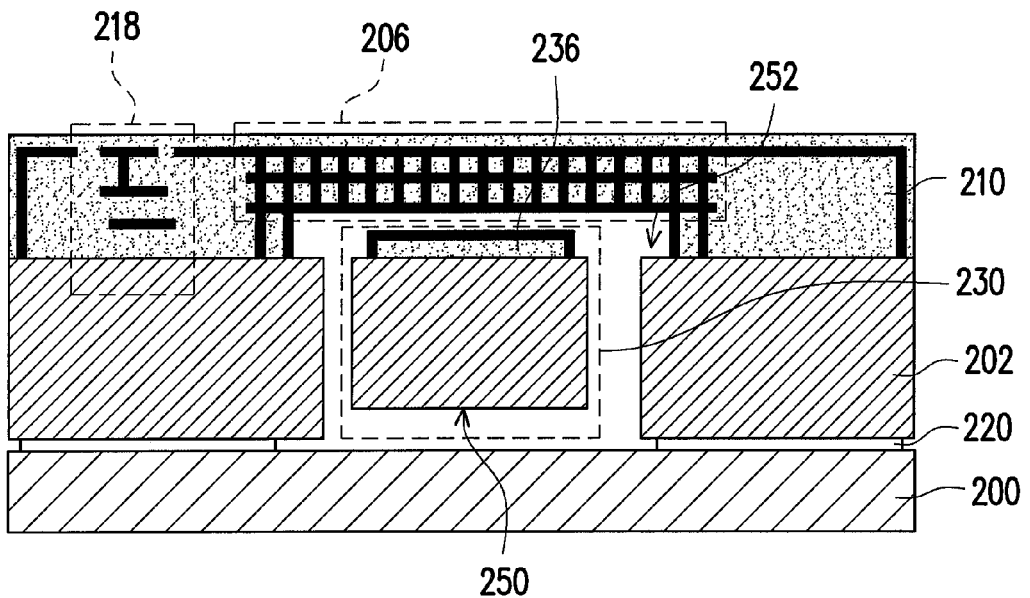

In FIG. 8, an isotropic etching process is performed to etching the dielectric material in the structural dielectric layer 210 to expose the conductive layer. In other words, the structural dielectric layer 210 has the indent space 252 to serving as a part of the chamber. In this example, the MEMS structure 230 also includes an addition part 236 from the structural dielectric layer 210. However, most part of the MEMS structure 230 is separated from the structural dielectric layer 210 to let the MEMS structure to sense the acceleration, for example. In FIG. 9, in order to have the hermetic space, the first substrate 200 is used to seal the chamber 208 form another side of the second substrate 202. The first substrate 200 can be adhered to the second substrate 202 by the adhesive layer 220, such as adhering material layer or fusing layer. The adhesive layer 220 is a ring to enclose the chamber 208. Before the substrate 200 is adhered to the second substrate 202, the chamber 208 may be vacuumed to have a certain low pressure level.

Figure 10:
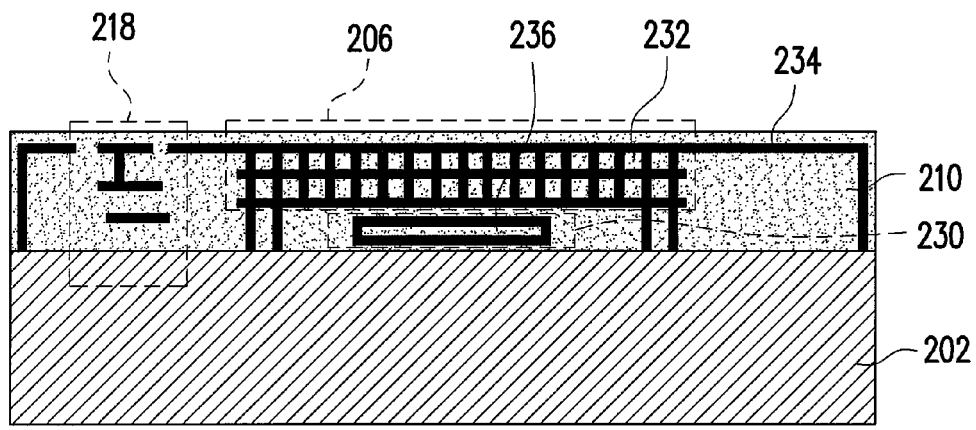
FIGS. 10-13 are cross-sectional views, schematically illustrating a fabrication flow for another MEMS package, according to one of embodiments of the invention.

FIGS. 10-13 are cross-sectional views, schematically illustrating a fabrication flow for another MEMS device, according to one of embodiments of the invention. In FIG. 10, for a different structure of MEMS device, the fabrication process in detail may be different while the design feature remains the same. In FIG. 10, starting from a stage, in which the MEMS device has been formed with the MEMS structure 230, the CMOS circuit 218, and the hermetic layer 206 in the structural dielectric layer 210. The hermetic layer 206 has the embedded grid structure 232, for example. The surrounding metal layer 234 is also formed in the structural dielectric layer 210. At this stage in fabrication, the structural dielectric layer 210 is formed on the substrate 202, such as the silicon substrate. However, the MEMS structure 230 in this example is designed to be just in the structural dielectric layer 210 which the substrate 202 is just for providing the chamber.

Figure 11:
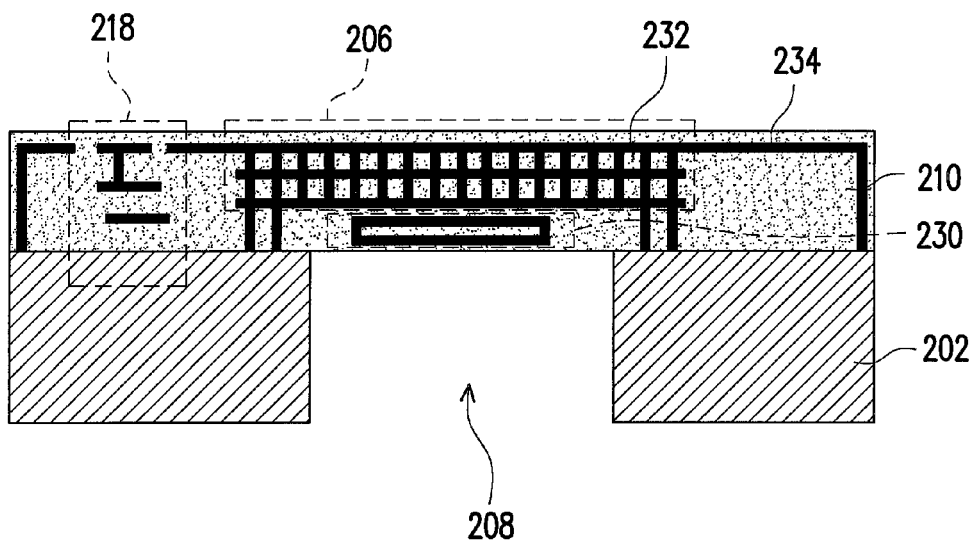
Figure 12:
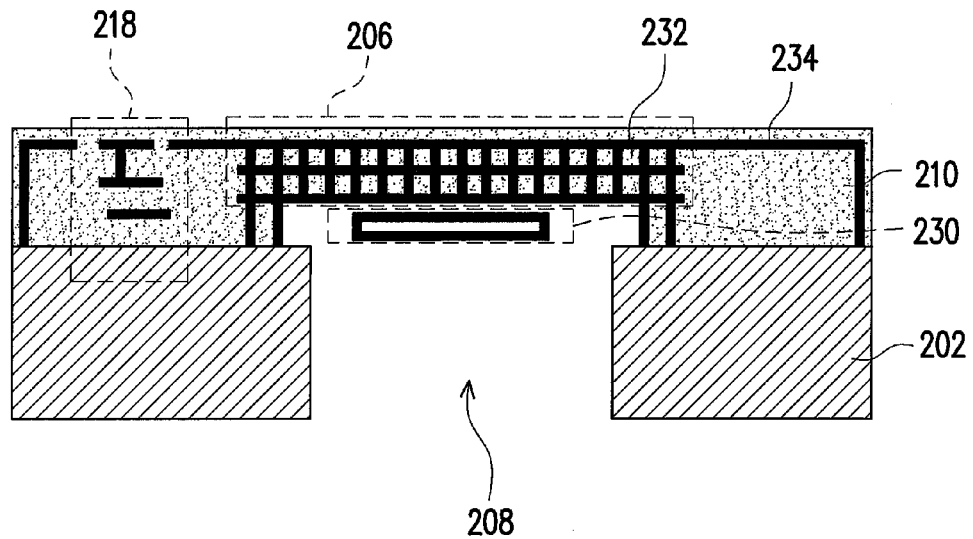

In FIG. 11, the substrate 202 is patterned to form an opening to serve as a main part of the chamber 208. The chamber 208 exposes the structural dielectric layer 210. In FIG. 12, an isotropic etching process for dielectric material is performed on the structural dielectric layer 210, so as the conductive layer of the MEMS structure 230 and the grid structure 232 of the hermetic layer 206 is exposed. The MEMS structure of the MEMS structure 230 is separate from the structural dielectric layer 210 and the substrate 202 except the holding portion by the structural dielectric layer.

Figure 13:
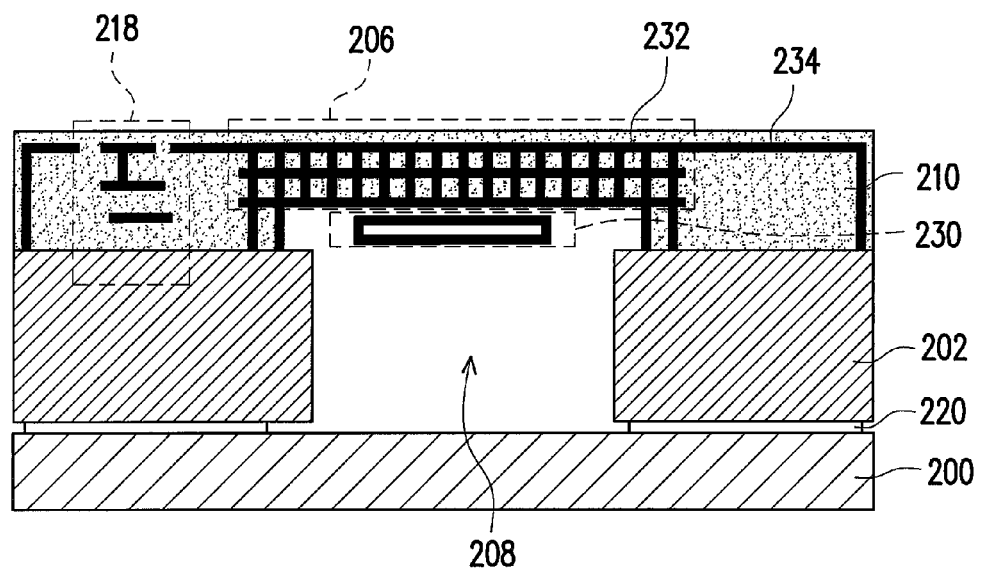

In FIG. 13, as previously described, in order to have the hermetic space, the first substrate 200 is used to seal the chamber 208 form another side of the second substrate 202. The first substrate 200 can be adhered to the second substrate 202 by the adhesive layer 220, such as adhering material layer or fusing layer. The adhesive layer 220 is a ring to enclose the chamber 208. Before the substrate 200 is adhered to the second substrate 202, the chamber 208 may be vacuumed to have a certain low pressure level. The chamber 260 in the substrate 202 is just for serving as a main part of the chamber for adapting the MEMS structure 230, in this example.

In the following descriptions, the subsequent packaging process is described. After the MEMS die has been accomplished in fabrication, the MEMS die is then packaged into a MEMS chip as a MEMS device. The hermetic MEMS package can be implemented in current IC package technology in various manners. It can also package with other chip for multiple chip package (MCP) application.

Figure 14:
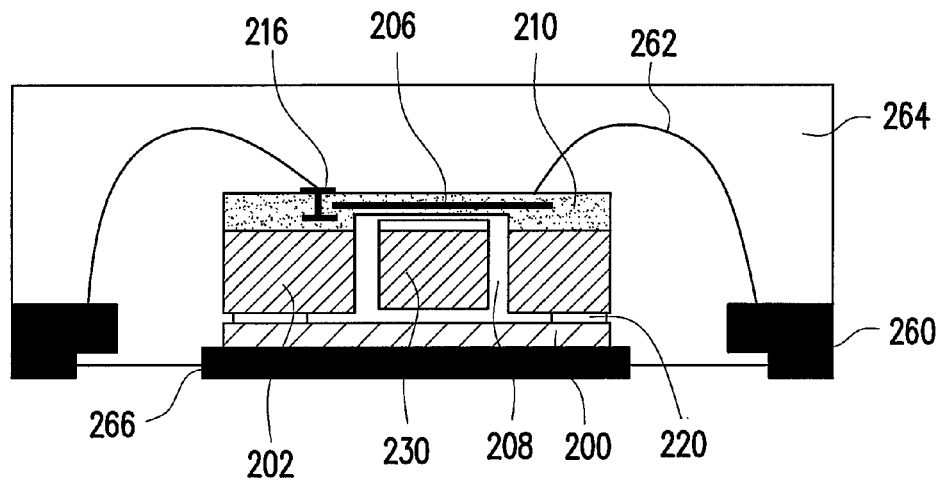
FIG. 14 is a cross-sectional view, schematically illustrating the packaged structure of the MEMS device, according to one of embodiments of the invention.

FIG. 14 is a cross-sectional view, schematically illustrating the packaged structure of the MEMS device, according to one of embodiments of the invention. In FIG. 14, a lead frame is used for package. The lead frame has a die pad 266 and leads 260. The MEMS die is held on the die pad 266. In addition, I/O terminals of the MEMS die are also connected to the leads 260 by the bonding wires 262. For example, the output pad structure 216 of the CMOS circuit is also connected to the corresponding lead 260. Then the molding compound 264 is used to mold the MEMS die as a MEMS device.

Figure 15:
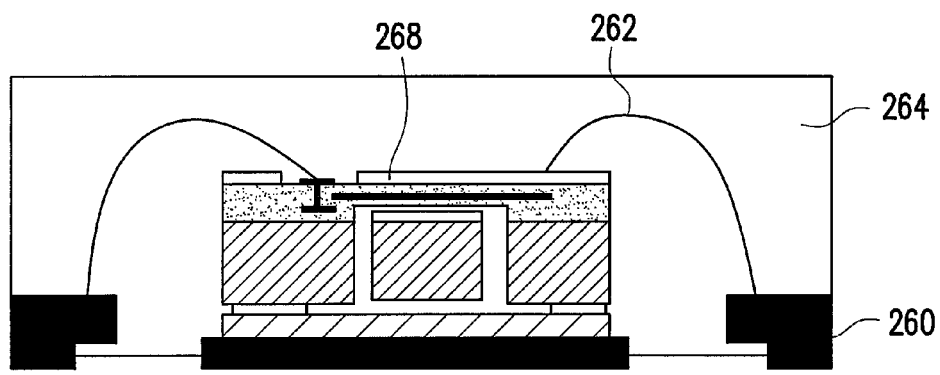
FIG. 15 is a cross-sectional view, schematically illustrating the packaged structure of the MEMS device, according to one of embodiments of the invention.

FIG. 15 is a cross-sectional view, schematically illustrating the packaged structure of the MEMS device, according to one of embodiments of the invention. In FIG. 15, it is similar to the structure in FIG. 14 but an addition protection layer 268 is included. The protection layer 268 can protect the hermetic layer of the MEMS die from damaging during forming molding compound 264, water jet, pick-and-place, and various handling process etc., during packaging processes. The protection layer has openings to expose the output pad structures 216 for bonding with the bonding wires 262.

Figure 16:
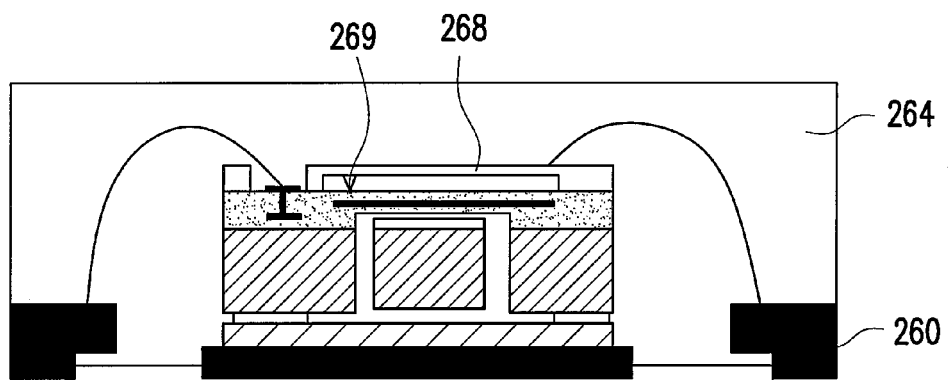
FIG. 16 is a cross-sectional view, schematically illustrating the packaged structure of the MEMS device, according to one of embodiments of the invention.

FIG. 16 is a cross-sectional view, schematically illustrating the packaged structure of the MEMS device, according to one of embodiments of the invention. In FIG. 16, the packaging structure is also based on the structure in FIG. 16 with modification for the protection layer. The protection layer 268 in this example is a cap structure with the cap space 269. The protection layer 268 in cap structure has the same function to protect the hermetic layer of the MEMS die from damaging during forming molding compound 264, water jet, pick-and-place, and various handling process etc., during packaging processes.

Figure 17:
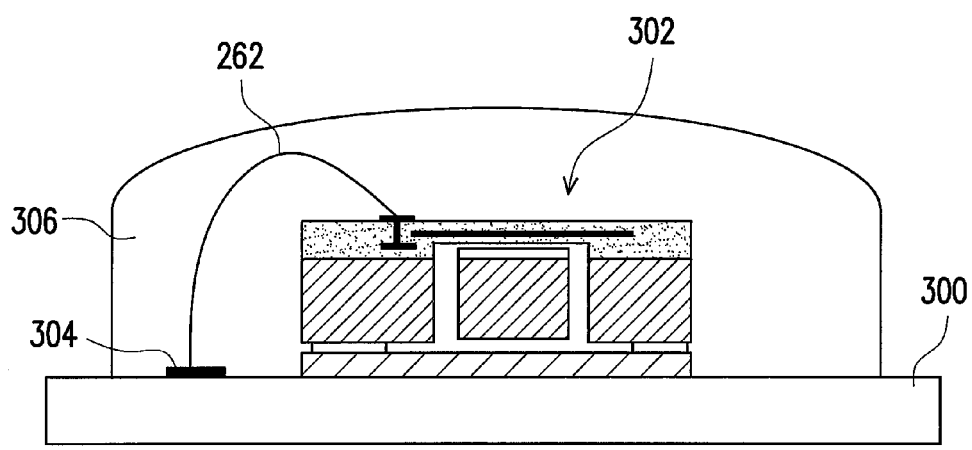
FIG. 17 is a cross-sectional view, schematically illustrating the packaged structure of the MEMS device, according to one of embodiments of the invention.

FIG. 17 is a cross-sectional view, schematically illustrating the packaged structure of the MEMS device, according to one of embodiments of the invention. In FIG. 17, the MEMS device 302 can also be mounted on system PCB (printed circuit board) 300 using COB (chip on board) technology. The output pad structure is bonded to the circuit pad 304 of PCB 300 by the wire 262. Then, the molding layer 306, such as the encapsulant layer, such as epoxy, can encapsulate over the MEMS device 302.

Figure 18A:
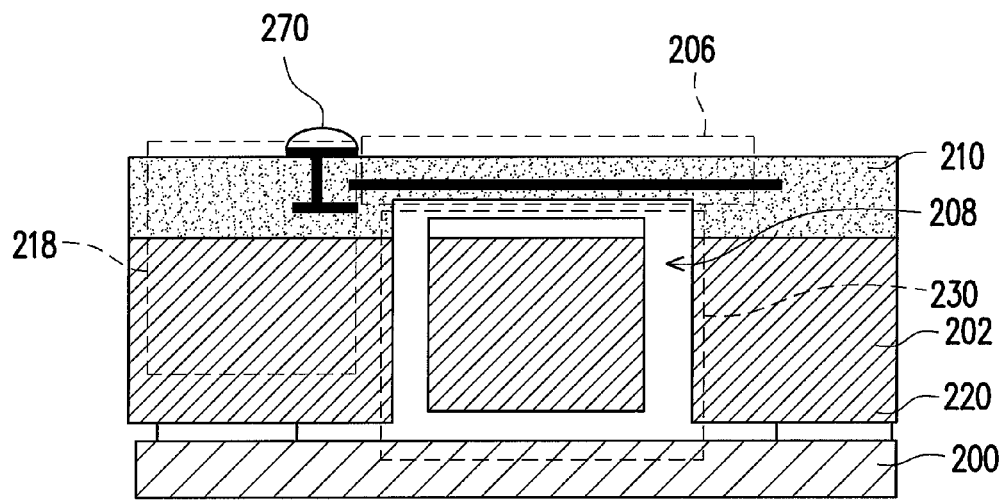
FIG. 18A is a cross-sectional view, schematically illustrating the packaged structure of the MEMS device, according to one of embodiments of the invention.
Figure 18B:
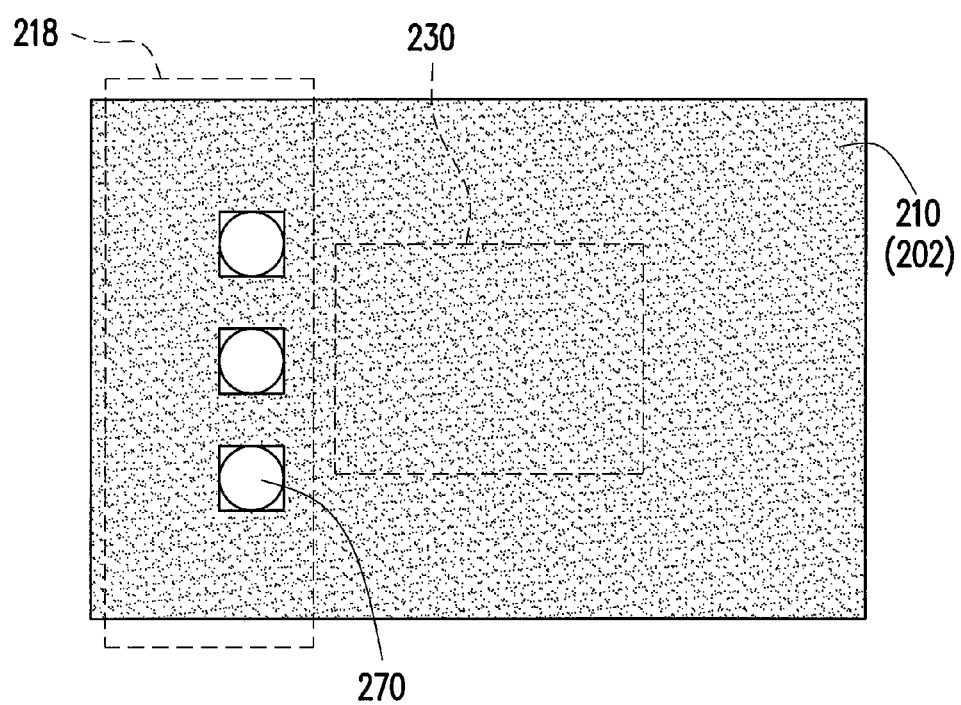
FIG. 18B is a top view, schematically illustrating the packaged structure from top view in FIG. 18A.

FIG. 18A is a cross-sectional view, schematically illustrating the packaged structure of the MEMS device, according to one of embodiments of the invention. FIG. 18B is a top view, schematically illustrating the packaged structure from top view in FIG. 18A. In FIG. 18A and FIG. 18B, in an alternative packaging process, it is based on flip chip process, for example. A bump 270 is formed on the output pad structure. The other structures of the MEMS device are like the previous descriptions without further description. After the bump 270 is formed on the output pad structure, such as the one in CMOS circuit 218, then the MEMS chip is bonded to the PCB by flip chip manner.

Figure 19:
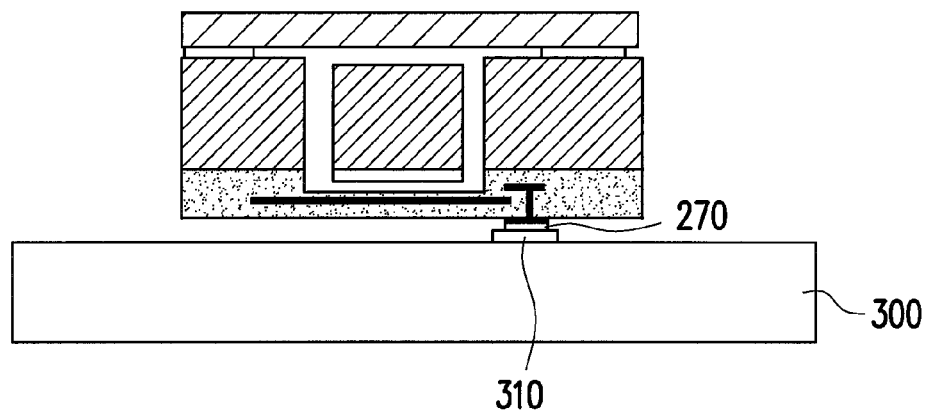
FIG. 19 is a cross-sectional view, schematically illustrating the packaged structure of the MEMS device, according to one of embodiments of the invention.

FIG. 19 is a cross-sectional view, schematically illustrating the application of the packaged structure of the MEMS device, according to one of embodiments of the invention. In FIG. 19, after the step in FIG. 18A, the MEMS device is bonded to the system PCB 300 at the pad 310 by the bump 270, such as solder bump or stud bump. If it is necessary, the encapsulant like the molding material can be formed over the PCB 300.

Figure 20:
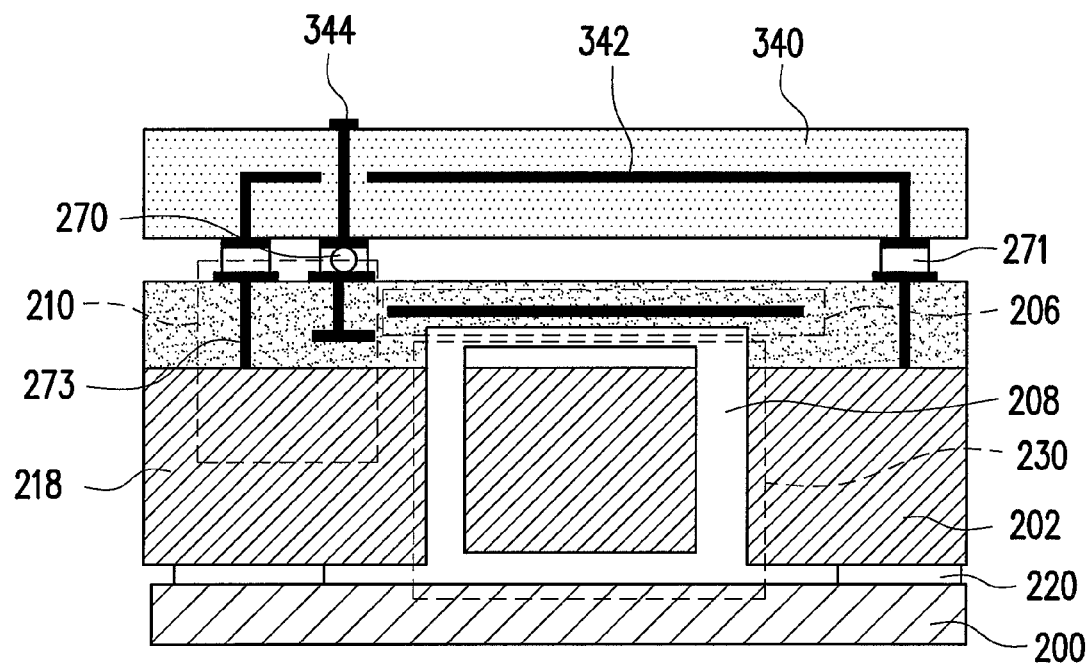
FIG. 20 is a cross-sectional view, schematically illustrating the packaged structure of the MEMS device, according to one of embodiments of the invention.

FIG. 20 is a cross-sectional view, schematically illustrating the packaged structure of the MEMS device, according to one of embodiments of the invention. In FIG. 20 for the alternative packaging process, the structural dielectric layer 210 may also include a supporting pad structure 273 together with the output pad structure 216. A third substrate 340 is formed over the structural dielectric layer 210 by packaging process with the adhering manner. The third substrate 340 also has embedded structures of the extending output pad structure 344 and the protection layer 342. The extending output pad structure 344 is electrically connected to the output pad structure 216 in the structural dielectric layer 210 by at least the bump 270. The end pad of the protection layer 342 is a ring structure surrounding the hermetic layer 206. Then, the third substrate 340 is adhered to the structural dielectric layer 210 by adhesive layer 271, which may be a B-stage epoxy in conductive type or non-conductive type. However, the conductive B-stage epoxy is preferred since it can at least help the electric connection between the output pad structure in the structural dielectric layer 210 and the extending output pad structure 344 in the third substrate 340.

Figure 21:
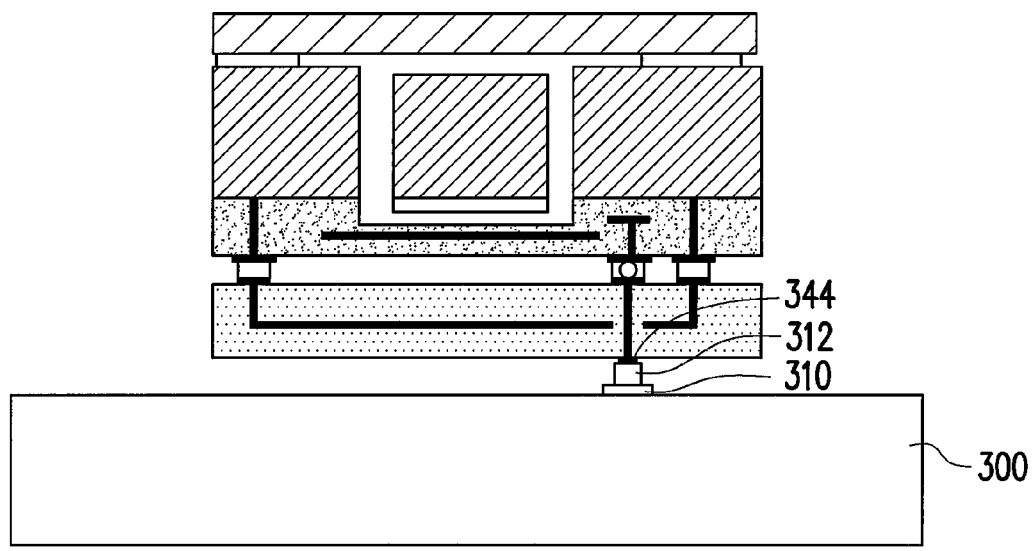
FIG. 21 is a cross-sectional view, schematically illustrating the packaged structure of the MEMS device, according to one of embodiments of the invention.

FIG. 21 is a cross-sectional view, schematically illustrating the packaged structure of the MEMS device, according to one of embodiments of the invention. In FIG. 21, after the third substrate is addition formed on the structural dielectric layer 210, the extending output pad structure 344 can be used to bond to the system PCB 300 at the pad 310 by flip chip manner with the bump 312 for application.

FIGS. 22A-22C are cross-sectional views, schematically illustrating the packaging process for the packaged structure of the MEMS device, according to one of embodiments of the invention. In FIG. 22A, the description of the packaging process starts from the stage that the second substrate 202 has be patterned to have the chamber space. In this example, the MEMS structure 230 is formed from the substrate 202 and the structural dielectric layer 210. In actual fabrication process, several MEMS device 400 are formed together at the same time. In FIG. 22B, the output pad structure 216, such as belonging to CMOS circuit, remains in the structural dielectric layer without bump. The substrate 200 is also adhered to the substrate 202 from the other side. In FIG. 22C, a protection layer 268 may be formed over the substrate 202 but expose the output pad structure 216. Then, the cutting process 402 is performed to cut the MEMS devices 400 into separated MEMS dies.

Figure 23:
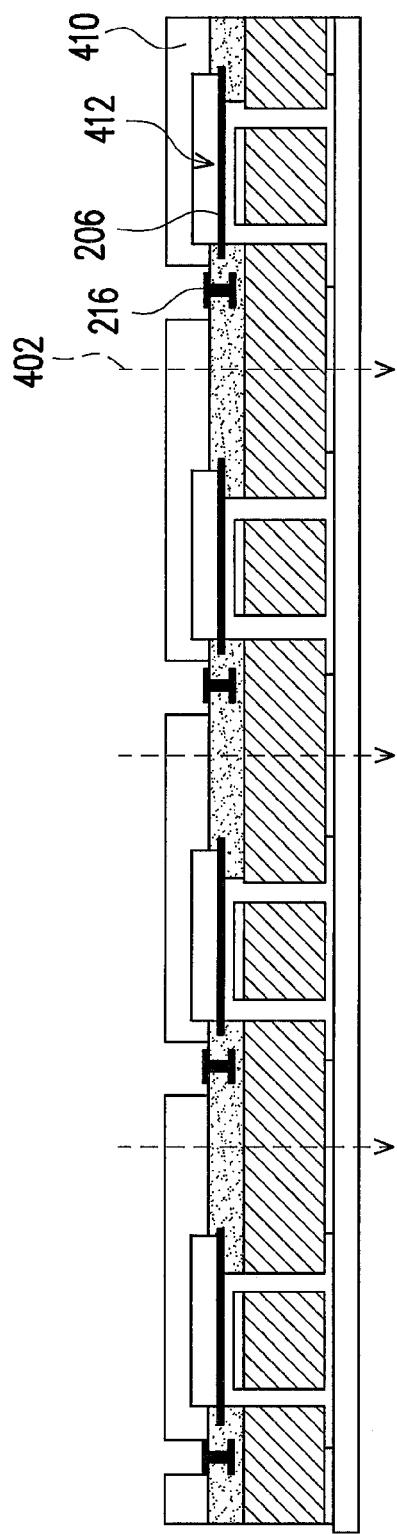
FIG. 23 is a cross-sectional view, schematically illustrating the packaged structure of the MEMS device, according to one of embodiments of the invention.

FIG. 23 is a cross-sectional view, schematically illustrating the packaged structure of the MEMS device, according to one of embodiments of the invention. It is like the processes in FIG. 22C but the protection layer 410 is in cap structure with an indent space 412 without directly contact the hermetic layer 206. Then, the cutting process 402 is performed. In the packaging process, the chamber can be vacuumed to a certain vacuum level.

FIGS. 24A-24C are cross-sectional views, schematically illustrating the packaging process for the packaged structure of the MEMS device, according to one of embodiments of the invention. In FIG. 24A, likewise, the description of the packaging process starts from the stage that the second substrate 202 has be patterned to have the chamber space. In this example, the MEMS structure 230 is formed from the substrate 202 and the structural dielectric layer 210. In actual fabrication process, several MEMS device 400 are formed together at the same time.

In FIG. 24B, the output pad structure 216, such as belonging to CMOS circuit, remains in the structural dielectric layer without bump. The substrate 200 is also adhered to the substrate 202 from the other side by the adhesive layer 220. The chamber now is hermetic. The camber can has a certain vacuum level.

In FIG. 24C, a bump 270 can be formed on the output pad structure 216 for subsequent packaging process. Then, the MEMS device 400 is cut into separate units by the cutting process 402.

Figure 25A:
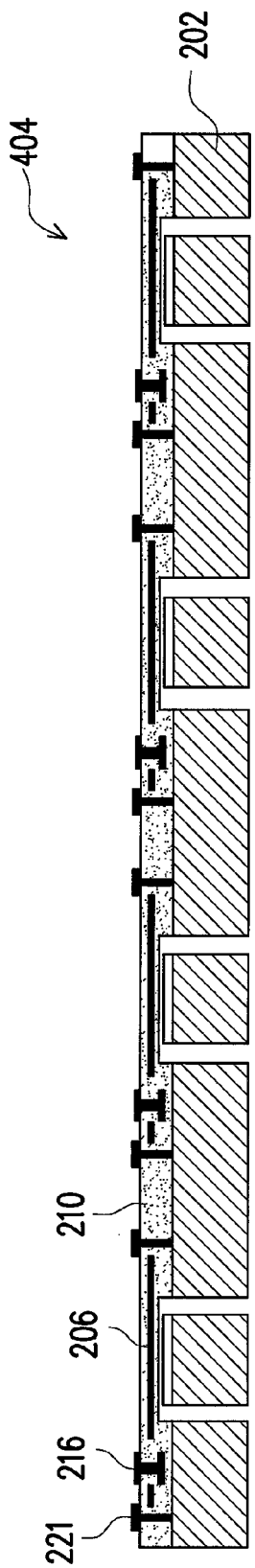
FIGS. 25A-25I are cross-sectional views, schematically illustrating the packaging process for the packaged structure of the MEMS device, according to one of embodiments of the invention.
Figure 25B:
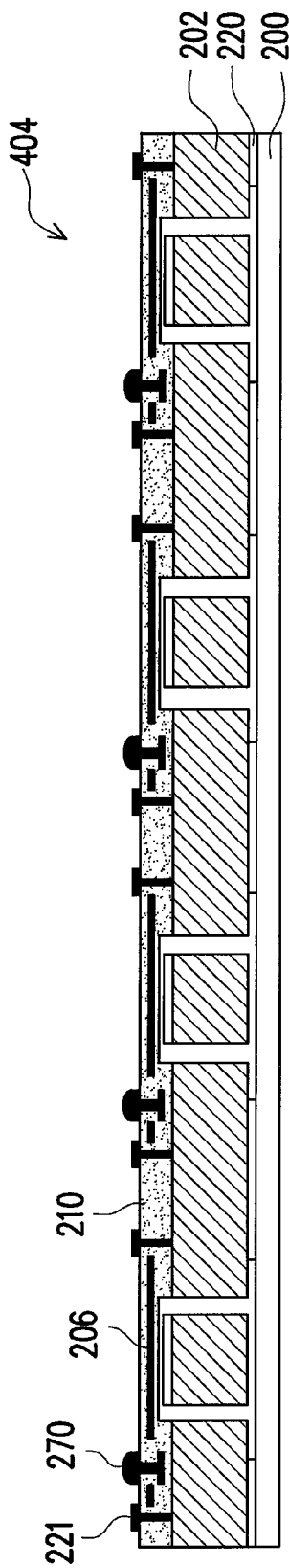

FIGS. 25A-25I are cross-sectional views, schematically illustrating the packaging process for the packaged structure of the MEMS device, according to one of embodiments of the invention. In FIG. 25A, the description of the packaging process starts from the stage that the second substrate 202 has be patterned to have the chamber space. In this example, the MEMS structure 230 is formed from the substrate 202 and the structural dielectric layer 210. In addition, a supporting ring 221 can be formed in the structural dielectric layer 210. The output pad structure 216 remains in the structural dielectric layer 210. In actual fabrication process, several MEMS device 404 are formed together at the same time. In FIG. 25B, the substrate 200 is adhered to the substrate 202 by the adhesive layer 220.

Figure 25C:
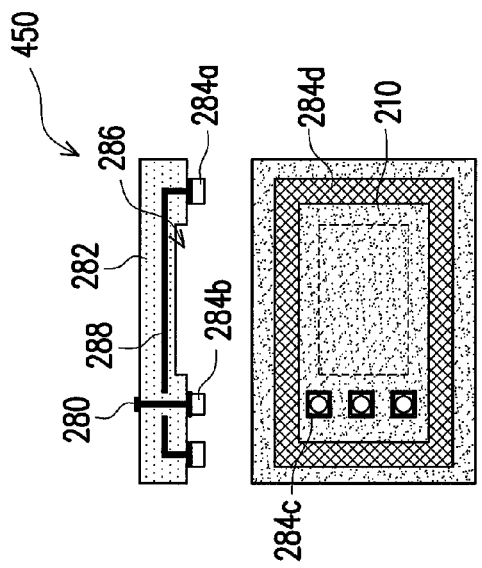

In FIG. 25C, a cap structure 450 is provided as shown in cross-sectional view. The MEMS device 404 is shown in top view. The cap structure 450 is formed from a third substrate 282. The cap structure 450 may have the indent space 286 in option. The third substrate 282 has internal structure including the extending output pad structure 280 and the protection layer 288, which has a closing ring, such as rectangular ring. The adhesive layers 284a and 284b are coated on the pads of the extending output pad structure. Accordingly, the adhesive layers 284c and 284d are also formed on the MEMS device 404. The adhesive layers can be, for example, B-stage epoxy.

Figure 25D:
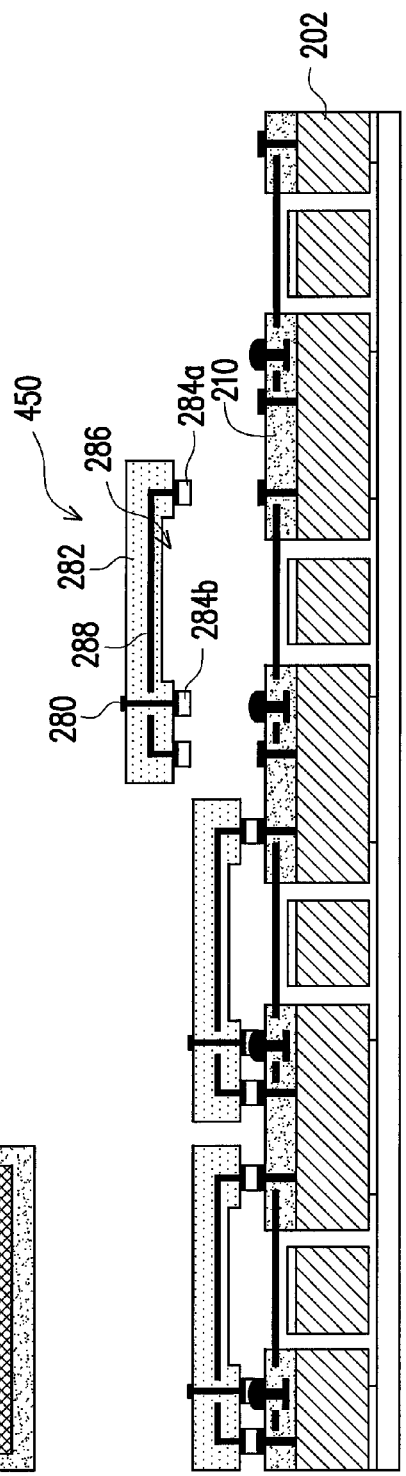
Figure 25E:
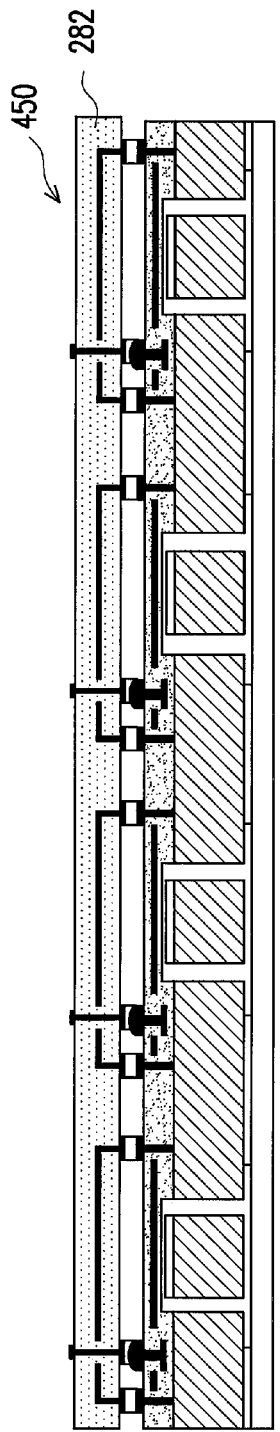

In FIG. 25D, the cap structures 450 are adhered onto the MEMS devices 404 one by one by the adhesive layers, as referred to chip scale package (CSP). The extending output pad structure 280 is connected to the output pad structure 216 by the bump 270. If the B-stage epoxy is conductive type, then the conductive B-stage epoxy can help the electric connection. Since the adhesive layer 284a is a closing ring, the adhesive ring can also improve the hermetic chamber. In FIG. 25E for alternative manner based on wafer level package (WLP), the cap structure 450 is formed in the substrate 282 in accordance with the substrate 202.

Figure 25F:
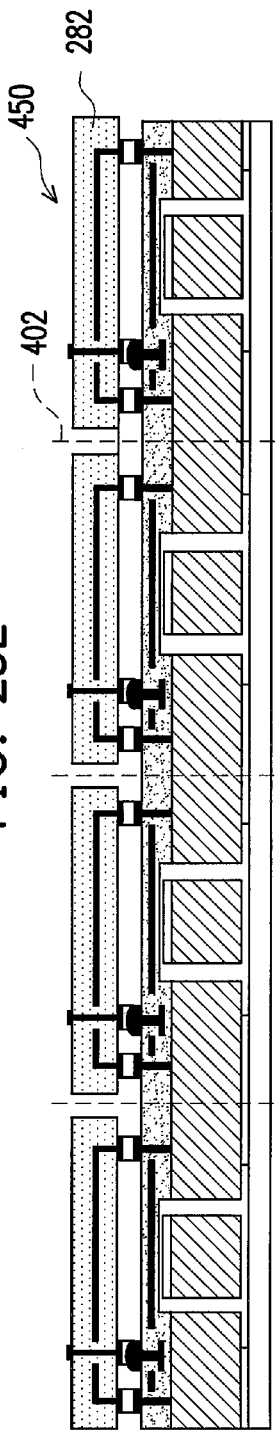
Figure 25G:
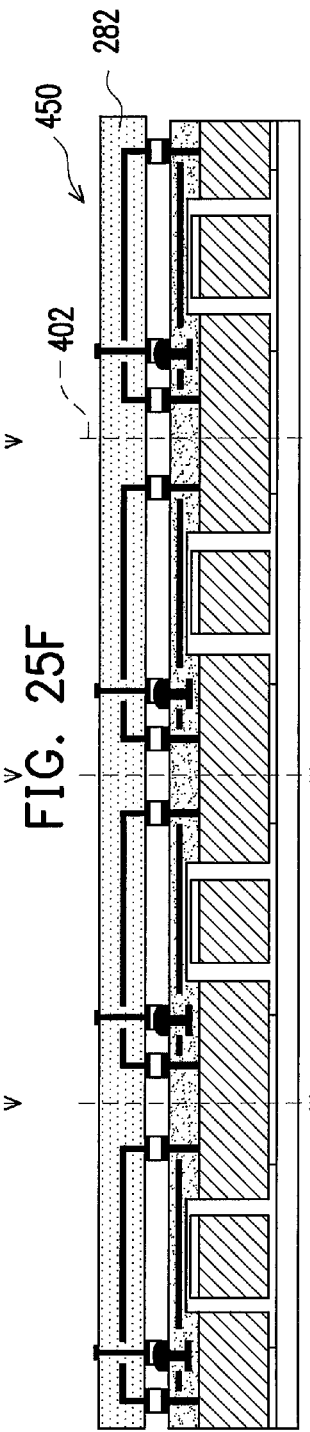

In FIG. 25F, following the step in FIG. 25D, the cutting process 402 is performed at the gap between the cap structures 450, so as to get the MEMS dies. The extending output pad structure can replace the output pad structure in the substrate 210. In FIG. 25G, following the step in FIG. 25E, the cutting process 402 is performed at the gap between the reserved cap structures 450, so as to get the MEMS dies.

Figure 25H:
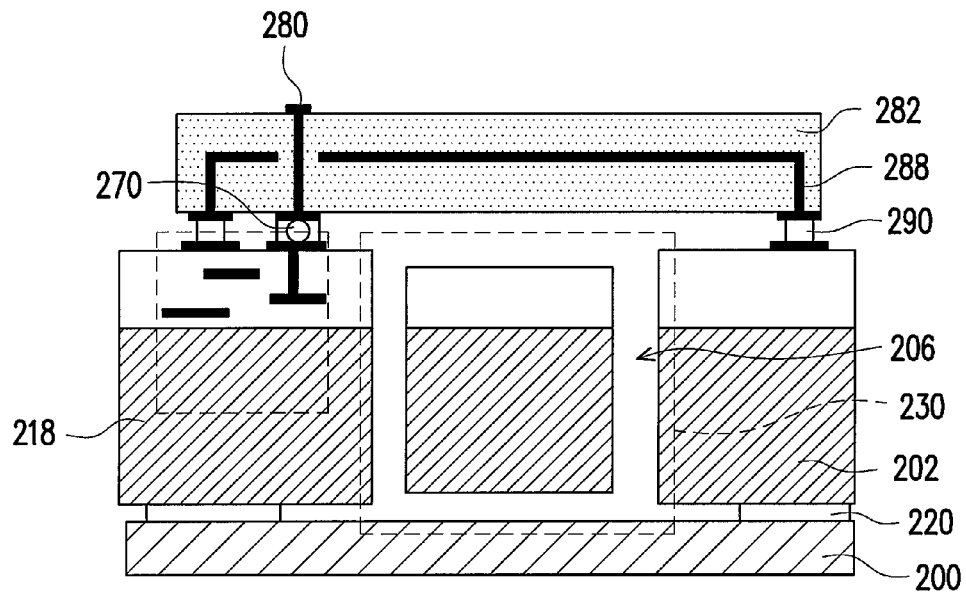

In FIG. 25H, after the cutting process, the individual MEMS devices as the MEMS dies are obtained. The adhesive layer 290 is the combination of the adhesive layers 284a, 284b, 284c, 284d, and enclosing the bump 270. However, the MEMS structure 230 of the MEMS device in this embodiment can be exposed and the cap structures 450 can serve as the hermetic layer. Due to the adhesive layer 290 seal the chamber 206.

Figure 25I:
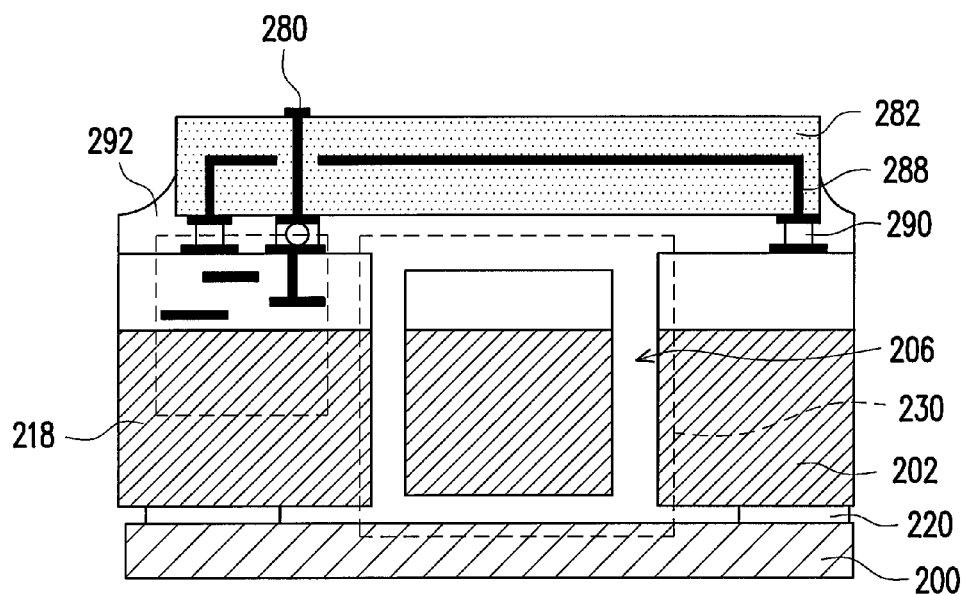

In FIG. 25I, the structure of this embodiment is basically the same as that in FIG. 25H. The difference is the additional side ring 292, which connects to the adhesive layer 290 and can further improve the hermetic effect.

Figure 26A:
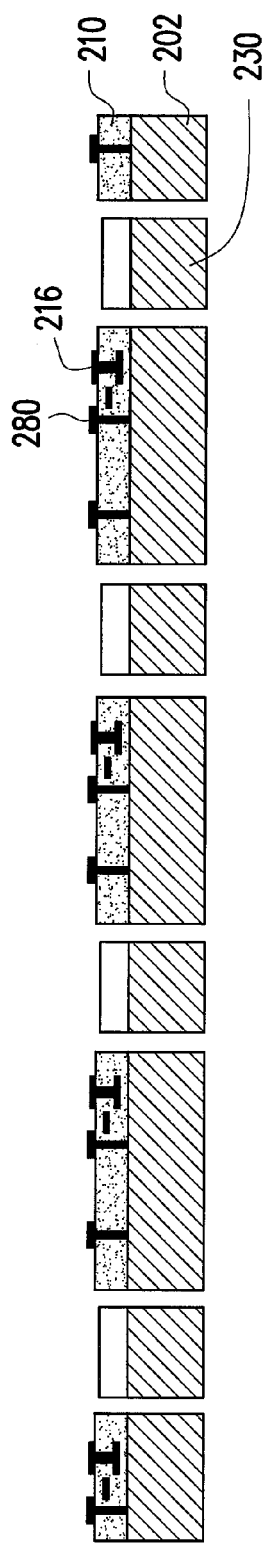

A further alternative packaging process with different MEMS structure is provided as well. FIGS. 26A-26I are cross-sectional views or top views, schematically illustrating the packaging process for the packaged structure of the MEMS device, according to one of embodiments of the invention. In FIG. 26A, the packaging process starts from the stage, in which some MEMS structure has been formed. The structural dielectric layer 210 has several conductive layers as the interconnection structure for the CMOS circuit. The support ring 280 is also formed in the structural dielectric layer. The MEMS structure 230 in this embodiment is open. The structural dielectric layer 210 does not have hermetic layer.

Figure 26B:
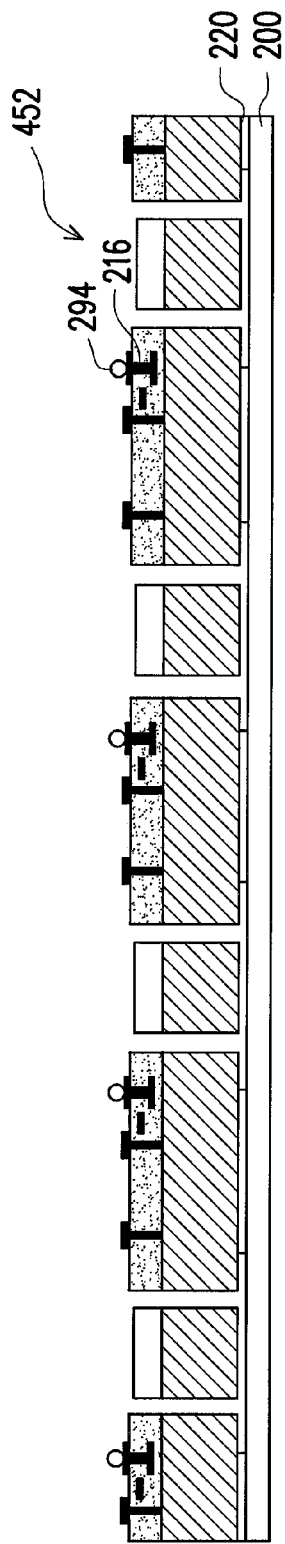
Figure 26C:
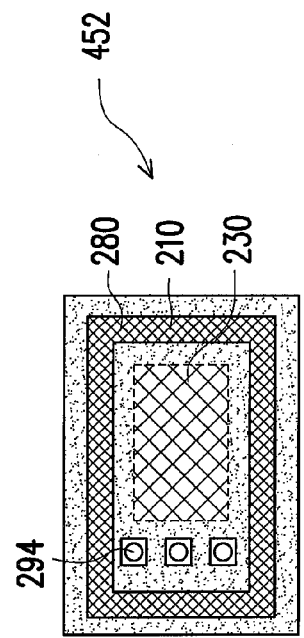

In FIG. 26B, the substrate 200 is adhered to the substrate 202 by the adhesive layer 220 as previously described. The bumps 294 are also formed on the output pad structures 216. At this stage, the MEMS device 452 has been accomplished in fabrication. In FIG. 26C, a top view for the single MEMS device 452 at this stage is shown. The supporting ring 280 surrounds the MEMS structure 230 and the bumps 294 are formed on the output conductive structure 216.

In FIG. 26D, the cap structure 450 in cross-sectional view and the MEMS device 452 in top view are shown. The adhesive layers 284c and 284d, such as the B-stage epoxy are formed on the supporting ring 280 and the output pad structure 216 of the MEMS device. The adhesive layers 284a and 284b are formed on the corresponding locations of the cap structure 450, as previously described.

In FIG. 26E, for the CSP process, the cap structures 450, also serving as the third substrate, are adhered to the structural dielectric layer 210 of the MEMS device 452. In FIG. 26F, for the WLP manner, the substrate 282 with multiple cap structures 450 is adhered to the structural dielectric layer 210 on the supporting ring 280 and the output pad structure 216 by the adhesive layers, accordingly.

Figure 26H:
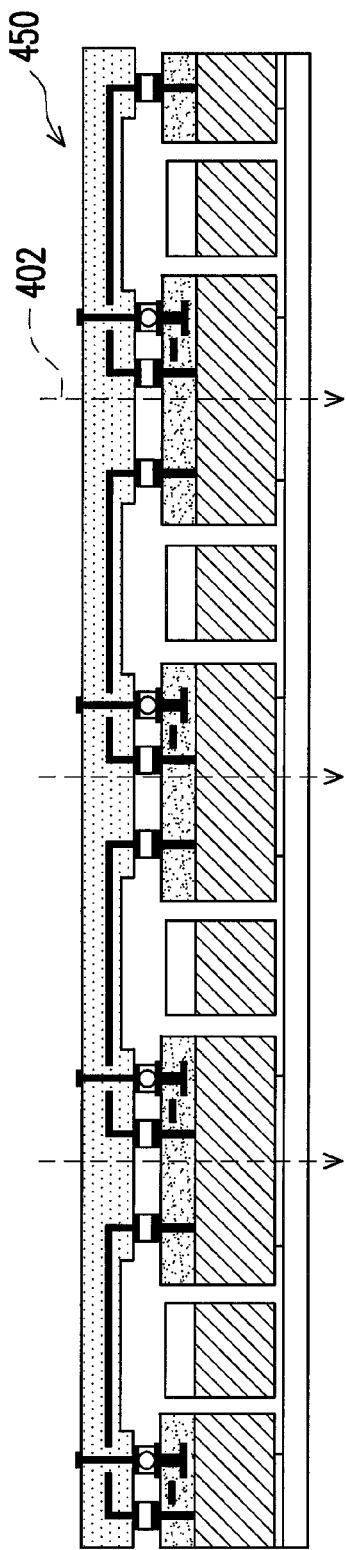

In FIG. 26G, the cutting process 402 is performed at the gap between the cap structures 450 for the structure in FIG. 26E. In FIG. 26H, the cutting process 402 is performed at the gap between the MEMS devices 452 for the structure in FIG. 26F.

Figure 26I:
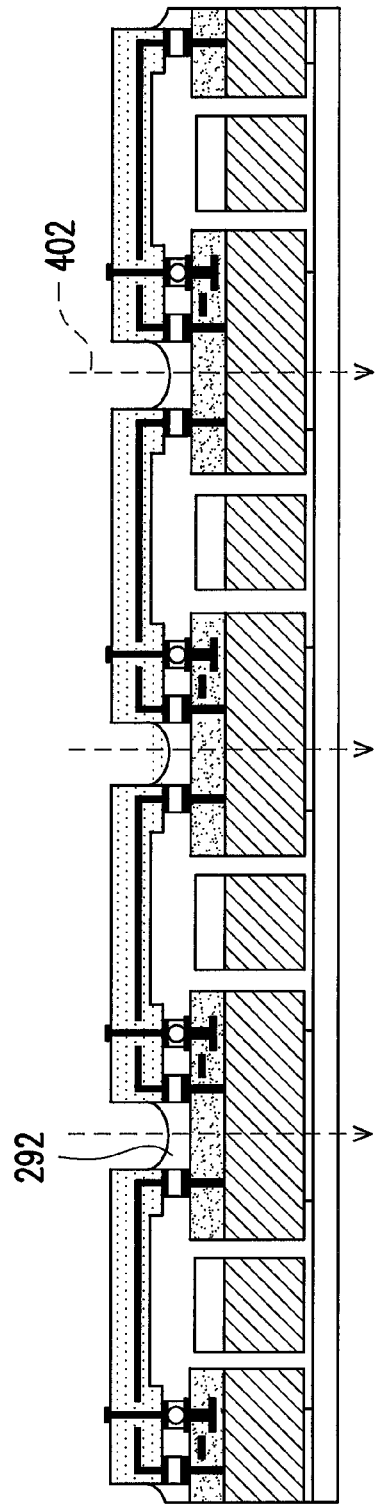

Alternatively, in FIG. 26I, the side ring 292 in FIG. 25I is formed at the gap between the cap structures 450. Then the cutting process 402 is performed.

Figure 27:
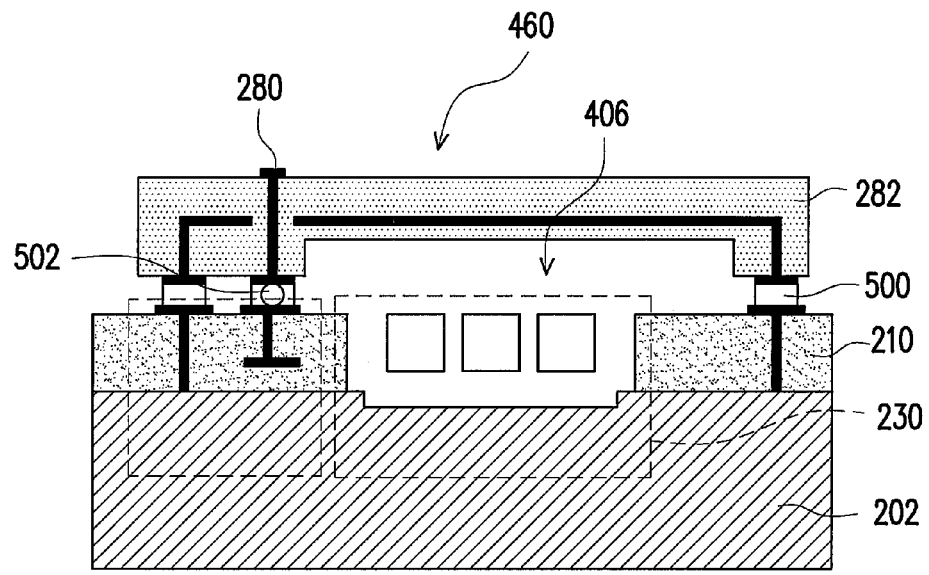
FIGS. 27-28 are cross-sectional views, schematically illustrating the packaged structures of the MEMS device, according to one of embodiments of the invention.
Figure 28:
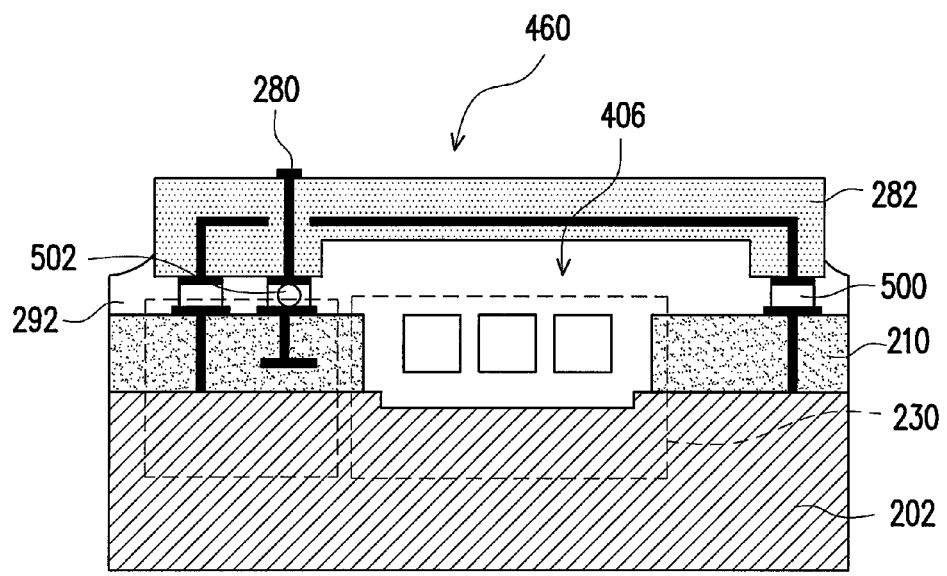

The MEMS device can also be in different structures. FIGS. 27 and 28 are cross-sectional views, schematically illustrating the packaged structures of the MEMS device, according to one of embodiments of the invention. In FIG. 27, the MEMS structure 406 is just formed from the structural dielectric layer 210. The substrate 200 may have an indent space, so that the hermetic chamber 406 is formed. The bump 500 and the adhesive layer 502 are like the previous structures and the description is omitted. The MEMS device 460 with the third substrate 282 is formed. The MEMS structure 406 is exposed in the chamber, which is hermetic due to the third substrate 282. Likewise in FIG. 28, a side ring 292 can be additionally included for the MEMS device 460, so as to improve the hermetic structure.

Figure 29A:
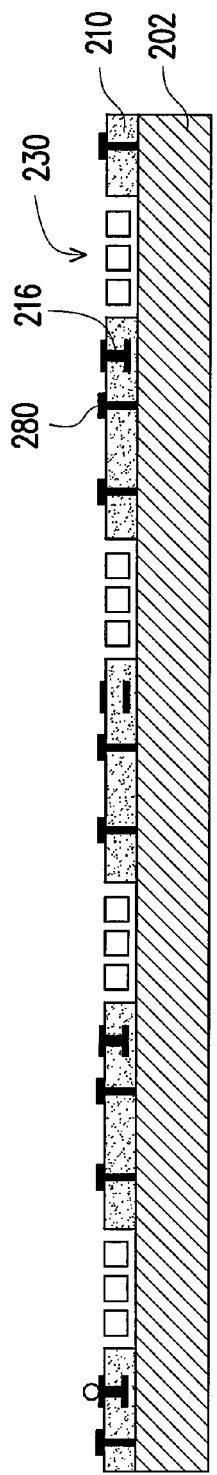

FIGS. 29A-29I are cross-sectional or top views, schematically illustrating the packaging process for the packaged structure of the MEMS device, according to one of embodiments of the invention. In FIG. 29A, for an alternative MEMS device, the packaging process starts from the stage, in which some MEMS structure has been formed. The structural dielectric layer 210 has several conductive layers as the interconnection structure for the CMOS circuit. The support ring 280 is also formed in the structural dielectric layer. The MEMS structure 230 in this embodiment is open and is just from the structural dielectric layer 210. The structural dielectric layer 210 does not have hermetic layer.

Figure 29B:
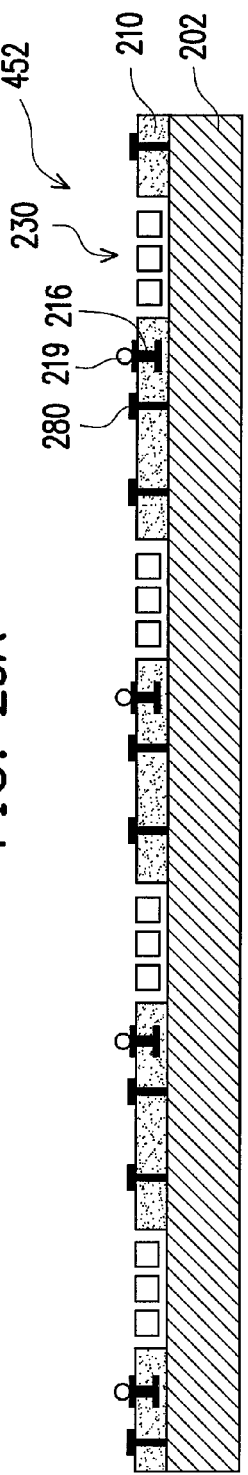

In FIG. 29B, the substrate 200 is adhered to the substrate 202 by the adhesive layer 220 as previously described. The bumps 219 are also formed on the output pad structures 216. At this stage, the MEMS device 452 has been accomplished in fabrication. In FIG. 26C, a top view for the single MEMS device 452 at this stage is shown. The supporting ring 280 surrounds the MEMS structure 230 and the bumps 219 are formed on the output conductive structure 216.

Figure 29C:
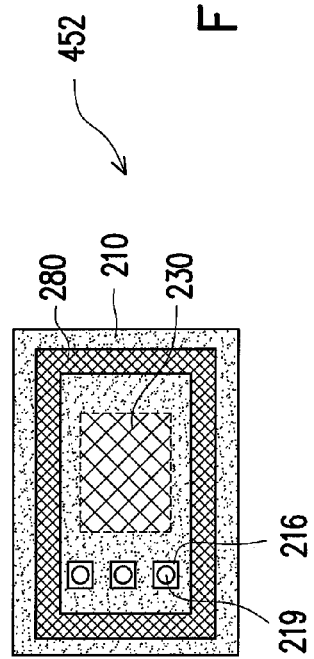

In FIG. 29C, a top view for the single MEMS device 452 at this stage is shown. The supporting ring 280 surrounds the MEMS structure 230 and the bumps 219 are formed on the output conductive structures 216.

In FIG. 29D, the cap structure 450 in cross-sectional view and the MEMS device 452 in top view are shown. The adhesive layers 284c and 284d, such as the B-stage epoxy are formed on the supporting ring 280 and the output pad structure 216 of the MEMS device. The adhesive layers 284a and 284b are formed on the corresponding locations In FIG. 29E, for the CSP process, the cap structures 450, also serving as the third substrate having hermetic layer, are adhered to the structural dielectric layer 210 of the MEMS device 452.

In FIG. 29F, the cutting process 402 is performed at the gap between the cap structures 450 for the structure in FIG. 29E. In FIG. 29G, the side ring 292 is also formed at the gap between the cutting process 402 is performed at the gap between the MEMS devices 452 for the structure in FIG. 26F.

In FIG. 29H, the substrate 282 has been formed with multiple cap structures 450. The protection layer 288 is also embedded in the third substrate 282. In FIG. 29I, the substrate 282 is adhered to the structural dielectric layer 210 by the adhesive layer. Then, the cutting process 402 is performed to cut the MEMS device 452 into multiple MEMS dies.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A hermetic microelectromechanical system (MEMS) package, comprising:

a CMOS MEMS chip, having a silicon substrate and a structural dielectric layer, wherein the silicon substrate have a first surface and a second surface opposite to the first surface and has a MEMS region and a CMOS integrated-circuit (IC) region, wherein CMOS transistors are formed on the first surface of the silicon substrate in the CMOS IC region and the silicon substrate is used as a transistor substrate of the CMOS transistors, wherein the silicon substrate is structural to form a chamber at the MEMS region and a MEMS structure within the chamber, wherein the structural dielectric layer comprises an interconnection structure formed on the first surface of the silicon substrate over the CMOS IC region and the MEMS region, wherein the interconnection structure is used to connect the CMOS transistors to form a CMOS IC and electrically couple between the CMOS IC and the MEMS structure within the chamber, wherein the interconnection structure further comprises a protection structure layer formed in the structural dielectric layer and the chamber is covered by the protection structure layer, wherein the chamber is exposed to an environment at the second surface of the silicon substrate, the interconnection structure further comprises an output pad structure to couple an electrical signal of the CMOS MEMS chip out; and a first substrate, adhered to the second surface of the first substrate on the chamber via an adhesive layer to form a hermetic space, wherein the MEMS structure is within the hermetic space.

2. The hermetic MEMS package of claim 1, wherein the MEMS structure comprises a portion of the silicon substrate.

3. The hermetic MEMS package of claim 1, wherein the MEMS structure comprises a portion of the structural dielectric layer.

4. The hermetic MEMS package of claim 3, wherein the MEMS structure comprises a dielectric layer and a metal layer enclosing the dielectric layer.

5. The hermetic MEMS package of claim 1, wherein the protection structure layer comprises a hard mask layer or a structural conductive layer.

6. The hermetic MEMS package of claim 5, wherein the structural conductive layer comprises a grid structure over the chamber and a shielding layer over the MEMS structure and a CMOS circuit of the CMOS MEMS chip.

7. The hermetic MEMS package of claim 1, further comprising a metal bump on the output pad structure to couple the electrical signal out.

8. The hermetic MEMS package of claim 1, further comprising a second substrate disposed on the structural dielectric layer by an adhesive layer, wherein the second substrate also includes an extending output pad structure in electric connection with the output pad structure of the CMOS MEMS chip.

9. The hermetic MEMS package of claim 8, wherein the extending output pad structure in the second substrate layer electrically connected with the output pad structure of CMOS MEMS chip comprises conductive bumps or an adhesive layer on the output pad structure.

10. The hermetic MEMS package of claim 9, wherein the conductive bumps include stud bumps or solder bumps, wherein the adhesive layer on the output pad structure includes solder paste or conductive or non-conductive epoxy.

11. The hermetic MEMS package of claim 1, wherein the first substrate is a flat layer without circuit.

12. The hermetic MEMS package of claim 1, wherein the first substrate adhered to the second side of the first substrate comprises an adhesive layer or a fusion layer.

13. A package structure of microelectromechanical system (MEMS) device, comprising:
   a CMOS MEMS die, comprising:
      a CMOS MEMS chip, having a silicon substrate and a structural dielectric layer, wherein the silicon substrate have a first surface and a second surface opposite to the first surface and has a MEMS region and a CMOS integrated-circuit (IC) region, wherein CMOS transistors are formed on the first surface of the silicon substrate in the CMOS IC region and the silicon substrate is used as a transistor substrate of the CMOS transistors, wherein the silicon substrate is structural to form a chamber at the MEMS region and a MEMS structure within the chamber, wherein the structural dielectric layer comprises an interconnection structure formed on the first surface of the silicon substrate over the CMOS IC region and the MEMS region, wherein the interconnection structure is used to connect the CMOS transistors to form a CMOS IC and electrically couple between the CMOS IC and the MEMS structure within the chamber, wherein the interconnection structure further comprises a protection structure layer formed in the structural dielectric layer and the chamber is covered by the protection structure layer, wherein the chamber is exposed to an environment at the second surface of the silicon substrate, the interconnection structure further comprises an output pad structure to couple an electrical signal of the CMOS MEMS chip out; and
      a first substrate, adhered to the second surface of the silicon substrate via an adhesive layer over the chamber to form a hermetic space, wherein the MEMS structure is within the hermetic space;
   a packaging circuit substrate, for holding the MEMS die; and
   a molding layer, encapsulating over the MEMS die and the packaging circuit substrate.

14. The package structure of MEMS device of claim 13, wherein the packaging circuit substrate has a lead frame, having a die pad for holding the MEMS die and a plurality of leads being connected with the CMOS circuit in the CMOS MEMS chip via bonding wires.

15. The package structure of MEMS device of claim 13, wherein the MEMS die further comprises a protection layer over the MEMS structure, and the protection layer has an opening to expose the output pad structure.

16. The package structure of MEMS device of claim 13, wherein the MEMS die further comprises a protection cap layer over the MEMS structure with an indent space, and the protection cap layer has an opening to expose the output pad structure.

17. The package structure of MEMS device of claim 13, wherein the packaging circuit substrate is a printed circuit board, and the MEMS die is electrically connected to the printed circuit board by bonding wire.

18. The package structure of MEMS device of claim 13, wherein the packaging circuit substrate is a printed circuit board, and the MEMS die is electrically connected to the printed circuit board by solder bump in flip-chip packaging structure.

19. The package structure of MEMS device of claim 13, wherein the MEMS structure comprises a portion of the silicon substrate.

20. The package structure of MEMS device of claim 13, wherein the MEMS structure comprises a portion of the structural dielectric layer.

21. The package structure of MEMS device of claim 20, wherein the MEMS structure comprises a dielectric layer and a metal layer enclosing the dielectric layer.

22. The package structure of MEMS device of claim 13, wherein the protection structure layer comprises a hard mask layer or a structural conductive layer.

23. The package structure of MEMS device of claim 22, wherein the structural conductive layer comprises a grid structure over the chamber and a shielding layer over the MEMS structure and the CMOS circuit.

24. The package structure of MEMS device of claim 13, wherein a first substrate adhered to a second side of the first substrate comprise an adhesive layer or a fusion layer.

* * * * *